United States Patent
Orr et al.

(10) Patent No.: US 9,524,832 B2
(45) Date of Patent: *Dec. 20, 2016

(54) INTELLIGENT SAFETY DISCONNECT SWITCHING

(71) Applicant: Solantro Semiconductor Corp., Ottawa (CA)

(72) Inventors: Raymond Kenneth Orr, Kanata (CA); Antoine Marc Joseph Richard Paquin, Navan (CA); Edward Keyes, Ottawa (CA)

(73) Assignee: SOLANTRO SEMICONDUCTOR CORP, Ottawa (CA)

( * ) Notice: Subject to any disclaimer, the term of this patent is extended or adjusted under 35 U.S.C. 154(b) by 768 days.

This patent is subject to a terminal disclaimer.

(21) Appl. No.: 13/840,162

(22) Filed: Mar. 15, 2013

(65) Prior Publication Data

US 2014/0265638 A1   Sep. 18, 2014

(51) Int. Cl.
*H01H 9/00* (2006.01)
*H01L 31/02* (2006.01)
*G01R 31/40* (2014.01)

(52) U.S. Cl.
CPC .......... *H01H 9/00* (2013.01); *H01L 31/02021* (2013.01); *H02S 50/00* (2013.01); *Y02E 10/50* (2013.01); *Y10T 307/766* (2015.04); *Y10T 307/865* (2015.04)

(58) Field of Classification Search
None
See application file for complete search history.

(56) References Cited

U.S. PATENT DOCUMENTS

| | | |
|---|---|---|
| 6,271,651 B1 | 8/2001 | Stratakos et al. |
| 7,962,249 B1 | 6/2011 | Zhang et al. |
| 8,837,098 B2 | 9/2014 | Victor |
| 2001/0023703 A1 | 9/2001 | Kondo et al. |

(Continued)

FOREIGN PATENT DOCUMENTS

| | | |
|---|---|---|
| IT | WO2011128875 A1 | 10/2011 |
| JP | WO2013018794 A1 | 2/2013 |

(Continued)

OTHER PUBLICATIONS

Office Action issued on Aug. 14, 2015 in respect of U.S. Appl. No. 13/840,627 (9 pages).

(Continued)

*Primary Examiner* — Carlos Amaya
*Assistant Examiner* — Aqeel Bukhari
(74) *Attorney, Agent, or Firm* — Barnes & Thornburg, LLP

(57) ABSTRACT

Intelligent safety disconnect switching methods and arrangements for PhotoVoltaic (PV) panels are disclosed. A determination is made as to whether a reconnect condition, for reconnecting a PV panel to a power system from which the PV panel is disconnected, is satisfied. The PV panel is automatically reconnected to the power system responsive to determining that the reconnect condition is satisfied. A determination is then made as to whether a power system operating condition is satisfied on reconnection of the PV panel, and the PV panel is automatically disconnected from the power system responsive to determining that the power system operating condition is not satisfied on reconnection of the PV panel.

20 Claims, 16 Drawing Sheets

(56) References Cited

U.S. PATENT DOCUMENTS

| | | |
|---|---|---|
| 2007/0186969 A1 | 8/2007 | Kohler et al. |
| 2008/0164766 A1 | 7/2008 | Adest et al. |
| 2009/0207543 A1 | 8/2009 | Boniface et al. |
| 2010/0002349 A1 | 1/2010 | La Scala et al. |
| 2010/0071742 A1 | 3/2010 | de Rooij et al. |
| 2010/0288327 A1 | 11/2010 | Lisi et al. |
| 2011/0278955 A1 | 11/2011 | Signorelli et al. |
| 2012/0025617 A1* | 2/2012 | Mateicka ............... H01L 31/05 307/77 |
| 2012/0049879 A1 | 3/2012 | Crites |
| 2012/0161527 A1* | 6/2012 | Casey ............... H01L 31/02021 307/80 |
| 2012/0163048 A1 | 6/2012 | Victor |
| 2012/0173031 A1 | 7/2012 | Parameswaran et al. |
| 2012/0194003 A1 | 8/2012 | Schmidt et al. |
| 2012/0235687 A1 | 9/2012 | Abe et al. |
| 2012/0306289 A1 | 12/2012 | Pozsgay |
| 2012/0313455 A1 | 12/2012 | Latham |
| 2013/0009483 A1 | 1/2013 | Kawate et al. |
| 2013/0038129 A1 | 2/2013 | Bundschuh et al. |
| 2013/0057989 A1 | 3/2013 | Victor |
| 2013/0241297 A1 | 9/2013 | Falk et al. |
| 2014/0001865 A1 | 1/2014 | Osterloh et al. |
| 2014/0373894 A1 | 12/2014 | Stratakos et al. |

FOREIGN PATENT DOCUMENTS

| | | |
|---|---|---|
| WO | 2010078303 | 7/2010 |
| WO | 2012079742 | 6/2012 |

OTHER PUBLICATIONS

Solar fire and theft protection, Mar. 14, 2013, Photovoltaic news and pv jobs, www.pv-magazine.com/news/details/beitrag/solar-fire-and-theft-protection__100010.

Extended European Seach Report issued on Mar. 25, 2015 in respect of European Patent Office Application No. 14159173.5 (5 pages).

Extended European Search Report issued on Mar. 26, 2015 in respect of European Patent Office Application No. 14159176.8 (6 pages).

U.S. Final Office Action issued on Dec. 22, 2015 in respect of U.S. Appl. No. 13/840,627 (15 pages).

* cited by examiner

INTELLIGENT SAFETY DISCONNECT SWITCHING

FIELD OF THE INVENTION

This invention relates generally to the field of PhotoVoltaic (PV) solar panels and in particular to methods and apparatus for their safety.

BACKGROUND

Photovoltaic (PV) solar panels are an important source of electrical power. Large, megawatt arrays with PV panels numbering in the tens of thousands are increasingly common. A typical PV panel is organized as a series connection of individual PV cells. A common configuration is 72 PV cells per panel. A typical PV cell operating voltage under illumination is about 0.7 V. An illuminated PV panel with 72 Direct Current (DC) PV cells will therefore have an output voltage of about 50 volts DC. PV panels are typically connected in series to form a panel "string". In a DC PV panel system, the output of the PV panel string could connect to a central inverter which converts the DC power of the PV panels into AC power suitable for the electrical grid. Typically there are between five and twenty PV panels in a panel string producing a combined string voltage of several hundred volts.

PV panels produce power whenever they are illuminated. As described above, string voltages could reach hazardous levels of hundreds of volts. This voltage represents a safety hazard during PV panel installation and maintenance. If the PV panels are mounted to a roof or integrated into building structures, then these voltages can also represent a hazard during emergency operations such as fire fighting since the PV panels will continue to generate voltage even when the PV installation is disconnected from the electrical grid.

SUMMARY

According to an aspect of the disclosure a method involves: determining whether a reconnect condition, for reconnecting a PV panel to a power system from which the PV panel is disconnected, is satisfied; automatically reconnecting the PV panel to the power system responsive to determining that the reconnect condition is satisfied; determining whether a power system operating condition is satisfied on reconnection of the PV panel; automatically disconnecting the PV panel from the power system responsive to determining that the power system operating condition is not satisfied on reconnection of the PV panel.

In an embodiment, the reconnect condition includes a time condition, and the determining whether a reconnect condition is satisfied involves determining whether a time period has elapsed after disconnection of the PV panel from the power system.

The power system operating condition could include a current flow condition, in which case the determining whether a power system operating condition is satisfied might involve determining whether there is at least a minimum magnitude of current flow in the power system.

The determining whether there is at least a minimum magnitude of current flow in the power system could involve measuring current flow in the power system over a time during which the PV panel remains reconnected on reconnection to the power system.

The power system operating condition could be a current pulse condition, with the determining whether a power system operating condition is satisfied involving determining whether a current pulse is detected at the PV panel on reconnection of the PV panel to the power system.

Where the reconnect condition is a connected PV panel limit condition, the determining whether a reconnect condition is satisfied involves determining whether a predetermined number of other PV panels are reconnected to the power system within a predetermined period of time.

Determining whether a predetermined number of other PV panels are reconnected to the power system within a predetermined period of time could involve detecting, at the PV panel, current pulses generated in the power system on reconnection of the other PV panels to the power system during the predetermined period of time.

The determining whether a predetermined number of other PV panels are reconnected to the power system within a predetermined period of time could instead involve detecting, at the PV panel, signals sent by other PV panels on reconnection of the other PV panels to the power system during the predetermined period of time.

The method could also involve broadcasting a signal from the PV panel on connection of the PV panel to the power system.

In an embodiment, the reconnect condition is a connected PV panel limit condition, and the determining whether a reconnect condition is satisfied involves determining whether a predetermined minimum number of PV panels including the PV panel are ready to reconnect to the power system. The determining whether the predetermined minimum of PV panels are ready to reconnect to the power system could involve detecting, at the PV panel, current pulses generated in the power system on reconnection of the other PV panels to the power system, or detecting, at the PV panel, signals sent by other PV panels on reconnection of the other PV panels to the power system during the predetermined period of time.

The reconnect condition could also include a current pulse condition. The determining whether a reconnect condition is satisfied could then involve: reconnecting the PV panel to the power system; determining whether a current pulse is detected at the PV panel on reconnection of the PV panel to the power system; disconnecting the PV panel from the power system on detection of a current pulse or expiry of a pulse detection time period; determining that the reconnect condition is satisfied where a current pulse is detected at the PV panel during the pulse detection time period and the predetermined minimum of PV panels including the PV panel are ready to reconnect to the power system.

The determining whether the predetermined minimum of PV panels are ready to reconnect to the power system could involve detecting, at the PV panel, signals sent by other PV panels on reconnection of the other PV panels to the power system during the predetermined period of time, in which case the determining whether a reconnect condition is satisfied could involve: reconnecting the PV panel to the power system; determining whether a current pulse is detected at the PV panel on reconnection of the PV panel to the power system; broadcasting a signal from the PV panel on detection of a current pulse during a pulse detection time period; disconnecting the PV panel from the power system on detection of a current pulse or expiry of the pulse detection time period; determining that the reconnect condition is satisfied where a current pulse is detected at the PV panel during the pulse detection time period and the predetermined minimum of PV panels including the PV panel are ready to reconnect to the power system.

In an embodiment, the reconnecting involves reconnecting the predetermined minimum number of PV panels to the power system on determining that the predetermined minimum of PV panels are ready to reconnect to the power system.

The reconnect condition could be a numeric value condition, with the determining whether a reconnect condition is satisfied involving comparing a random number associated with the PV panel to a predefined value.

The reconnect condition could be receipt of a connect command from a grid sensor coupled to the power system, in which case the determining whether a reconnect condition is satisfied involves determining whether the connect command is received.

A PV panel disconnect switching arrangement includes: switches to control connection of the PV panel to a power system and bypass of the PV panel on disconnection of the PV panel from the power system; a controller operatively coupled to the switches, to determine whether a reconnect condition for reconnecting the PV panel to the power system is satisfied, to automatically reconnect the PV panel to the power system responsive to determining that the reconnect condition is satisfied, to determine whether a power system operating condition is satisfied on reconnection of the PV panel, to automatically disconnect the PV panel from the power system responsive to determining that the power system operating condition is not satisfied on reconnection of the PV panel.

The controller could be configured to determine that the reconnect condition is satisfied where one or more of: a time period has elapsed after disconnection of the PV panel from the power system; a predetermined number of other PV panels are reconnected to the power system within a predetermined period of time; a predetermined minimum number of PV panels including the PV panel are ready to reconnect to the power system; a random number associated with the PV panel has a predetermined relationship to a predefined value; a connect command is received from a grid sensor coupled to the power system.

In an embodiment, the controller is configured to determine that the reconnect condition is satisfied where one or more of: there is at least a minimum magnitude of current flow in the power system; a current pulse is detected at the PV panel on reconnection of the PV panel to the power system.

According to another aspect, a method involves: detecting, at a PV panel that is connected to a power system, a low current condition or an arc fault condition in the power system; automatically disconnecting the PV panel from the power system responsive to detection of the low current condition or the arc fault condition.

The detecting could involve independently detecting the low current condition or the arc fault condition at each of a plurality of PV panels, including the PV panel, that are connected to the power system, and the automatically disconnecting could involve independently automatically disconnecting each PV panel from the power system responsive to detection of the low current condition or the arc fault condition at each PV panel.

A PV panel disconnect switching arrangement includes: switches to control connection of the PV panel to a power system and bypass of the PV panel on disconnection of the PV panel from the power system; a controller operatively coupled to the switches, to detect a low current condition or an arc fault condition in the power system while the PV panel is connected to the power system, to automatically disconnect the PV panel from the power system responsive to detection of the low current condition or the arc fault condition.

DETAILED DESCRIPTION

Figure 1A:
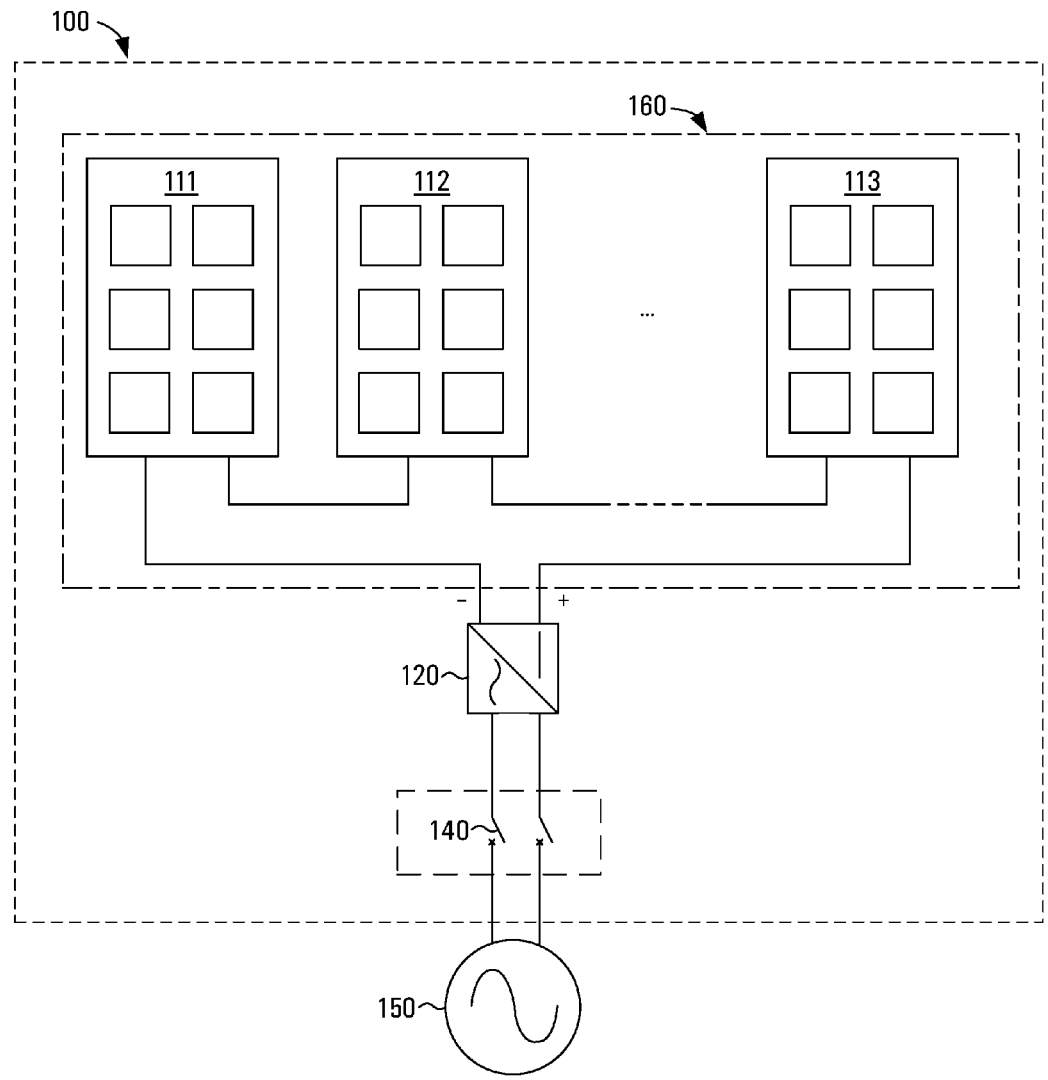
FIG. 1A is a block diagram of an example grid tied PV installation.

FIG. 1A is a block diagram of an example grid tied PV installation. The example installation 100 includes a panel string 160 connected to the DC inputs of a central inverter 120. String 160 includes individual PV panels 111, 112, 113. The output of inverter 120 connects to electrical grid 150 through grid disconnect switch 140. FIG. 1A is an example only and other arrangements are possible.

Figure 1B:
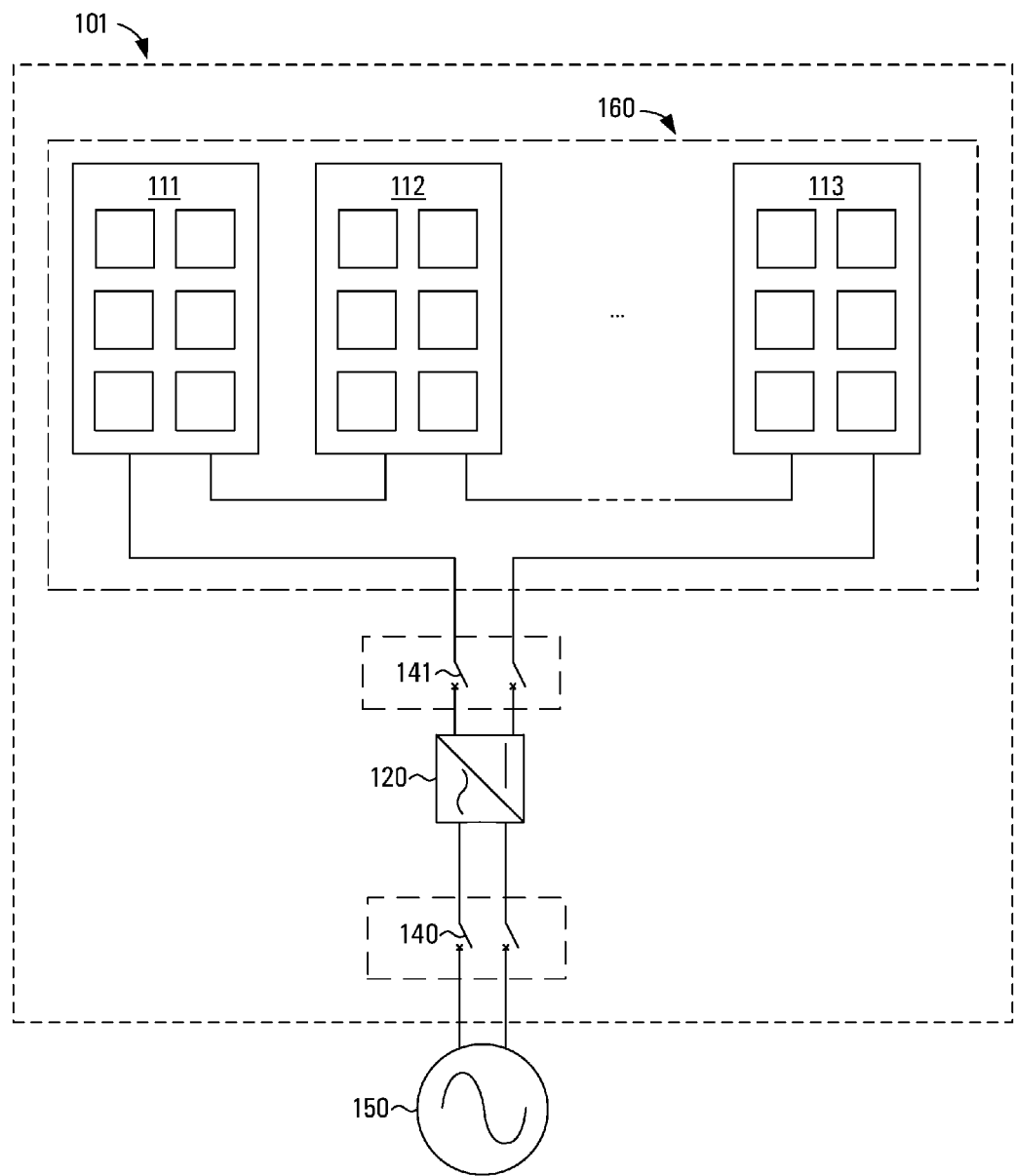
FIG. 1B is a block diagram of another example grid tied PV installation.

FIG. 1B, for instance, is a block diagram of another example grid tied PV installation. In this example installation 101, there is an additional disconnect switch 141 between string 160 and the inputs of the inverter 120. In FIGS. 1A and 1B, other disconnect means may be used between the string 160 and the inverter 120 and/or between the inverter 120 and the grid 150, including fuses for example.

As noted above, power production by PV panels under illumination can represent a potential safety hazard. It could therefore be useful to have PV panels in a PV installation isolate themselves and not output power whenever the PV installation was disconnected from the grid.

A PV installation may disconnect from the grid for any of a number of reasons. These could include a manual disconnect for maintenance purposes and/or during an emergency such as a fire. A PV installation might also or instead automatically disconnect due to an electrical fault on the grid. A PV installation will also be disconnected from the grid prior to its commissioning.

It might also be useful if PV panels isolated themselves in the event of an open circuit in a PV panel string. This might be caused by, for example: a physical break in the string; removal of one or more PV panels in the string for maintenance, repair, or replacement; disconnection of the string from a central inverter for inverter repair or replacement; a fault in the inverter; and/or during initial PV panel installation before all PV panels are installed in a string.

Figure 2A:
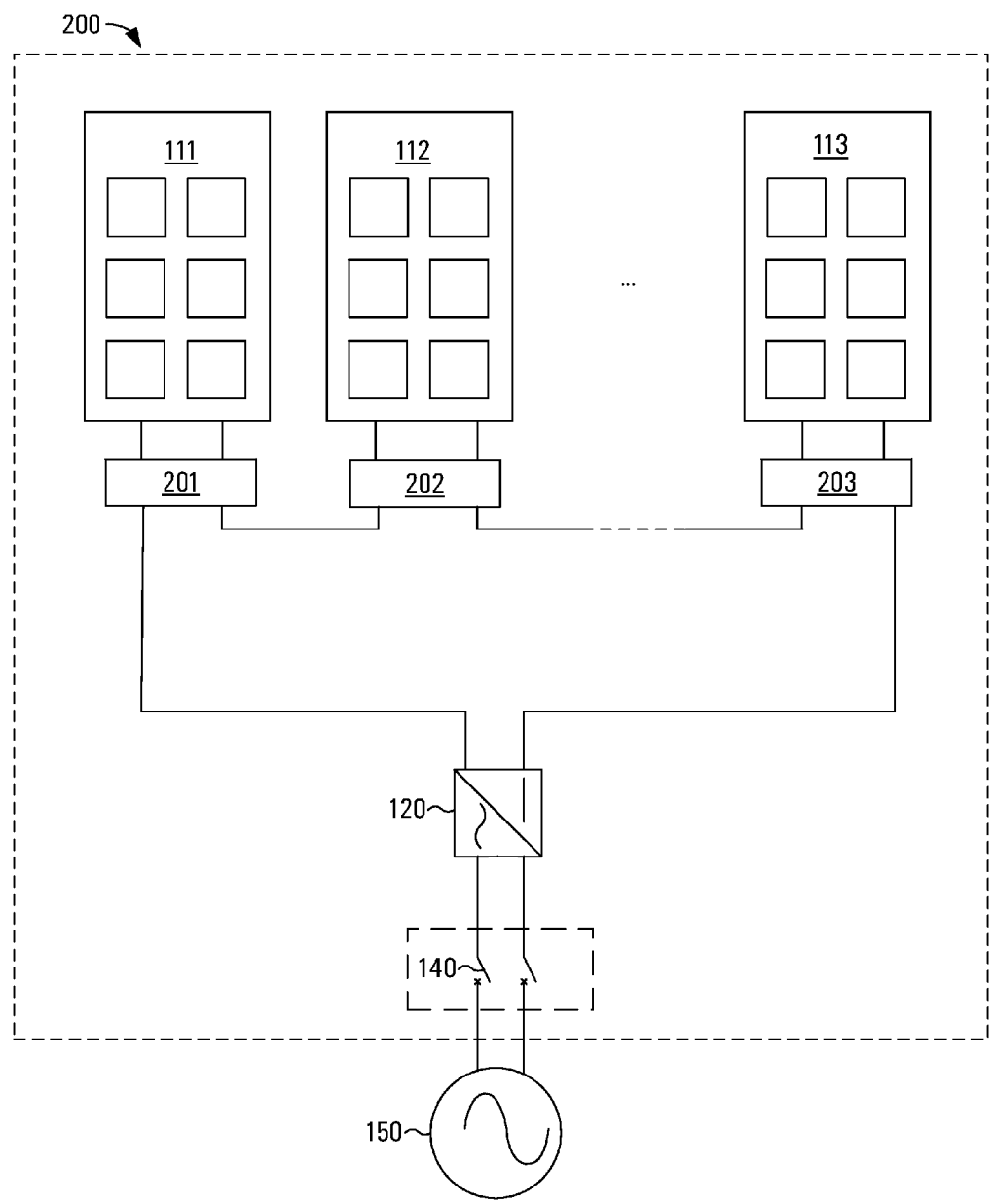
FIG. 2A is a block diagram of a further example grid tied PV installation.

FIG. 2A is a block diagram of a further example grid tied PV installation 200. The DC outputs of PV panels 111, 112, 113 respectively connect to the inputs of Intelligent Safety Disconnect Switches (ISDSs) 201, 202, 203. The ISDSs 201, 202, 203 disconnect their respective PV panels 111, 112, 113 from the string in the event of an open circuit or high resistance condition on the string. An open circuit condition could be caused by, for example, removal of one or more PV panels, a physical break in the string, the opening of a switch in the string, the blowing of a string fuse and/or a fault in inverter 120. A high resistance condition could be caused by, for example, disconnection of the PV installation from the electrical grid 150 and/or anti-islanding of the inverter 120. Anti-islanding refers to the automatic disconnection of a PV installation from the grid 150 when the PV installation detects that the main grid generator is no longer present. Anti-islanding prevents the creation of "power islands" on parts of the grid 150 during a power failure. If the example PV installation 200 disconnects from the grid 150 by, for example, opening of grid disconnect switch 140, then the input of inverter 120 will become high resistance and the string current will fall substantially to zero.

Figure 2B:
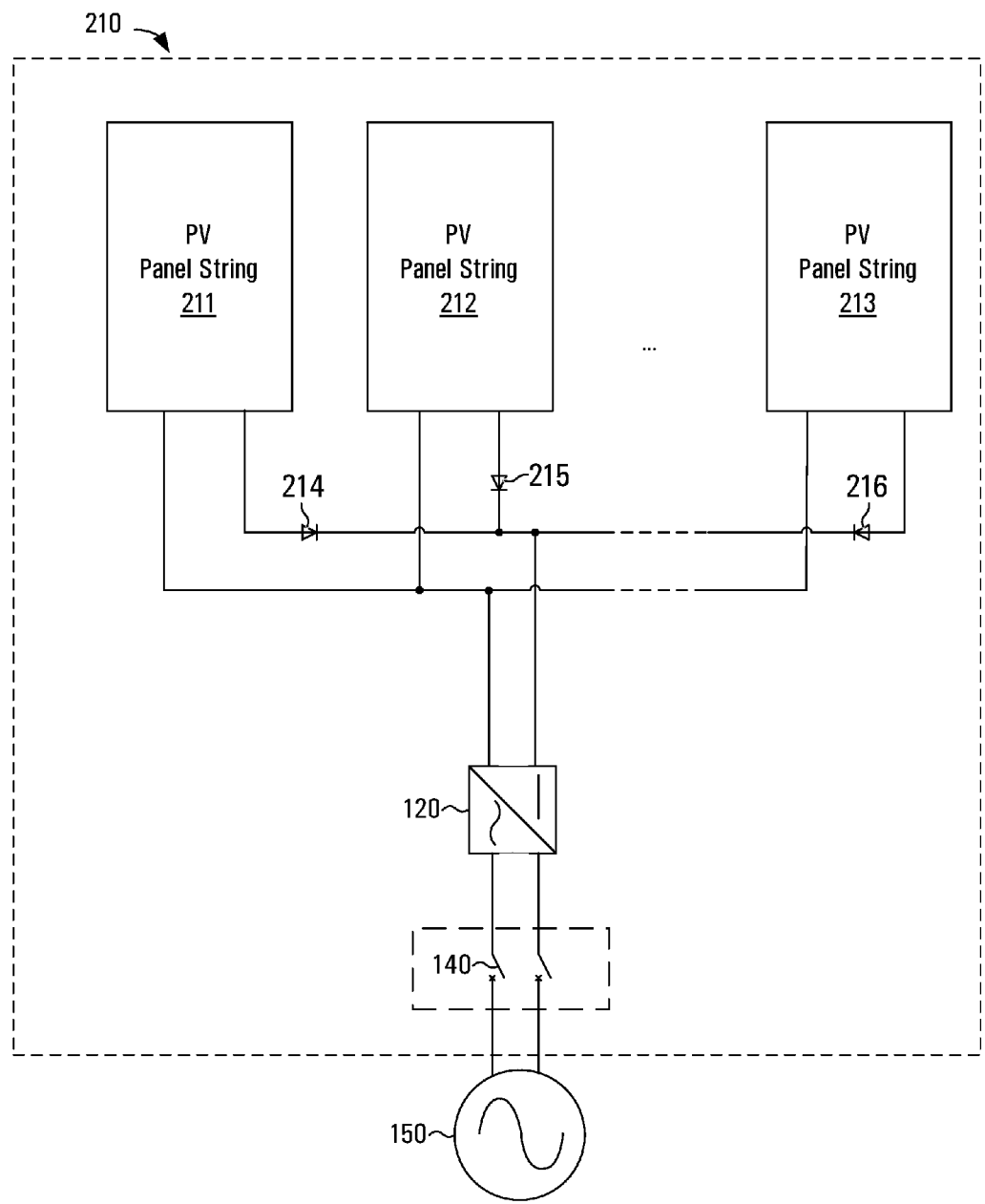
FIG. 2B is a block diagram of another example grid tied PV installation.

FIG. 2B is a block diagram of another example grid tied PV installation. In this example installation 210, PV panel strings 211, 212, 213 are connected in parallel to the inputs of inverter 120. Each PV panel string 211, 212, 213 includes a string of PV panels with respective ISDSs as shown in FIG. 2A for example. The example shown in FIG. 2A includes only one PV panel string, and the example shown in FIG. 2B includes multiple PV panel strings. The diodes 214, 215, 216 are provided in the example installation 210 to avoid "reverse" power flow from one PV panel string 211, 212, 213 to another PV panel string in which all PV panels are bypassed. Without the diodes 214, 215, 216, bypassing of all PV panels in any one string 211, 212, 213 would effectively shunt all of the other strings.

Figure 2C:
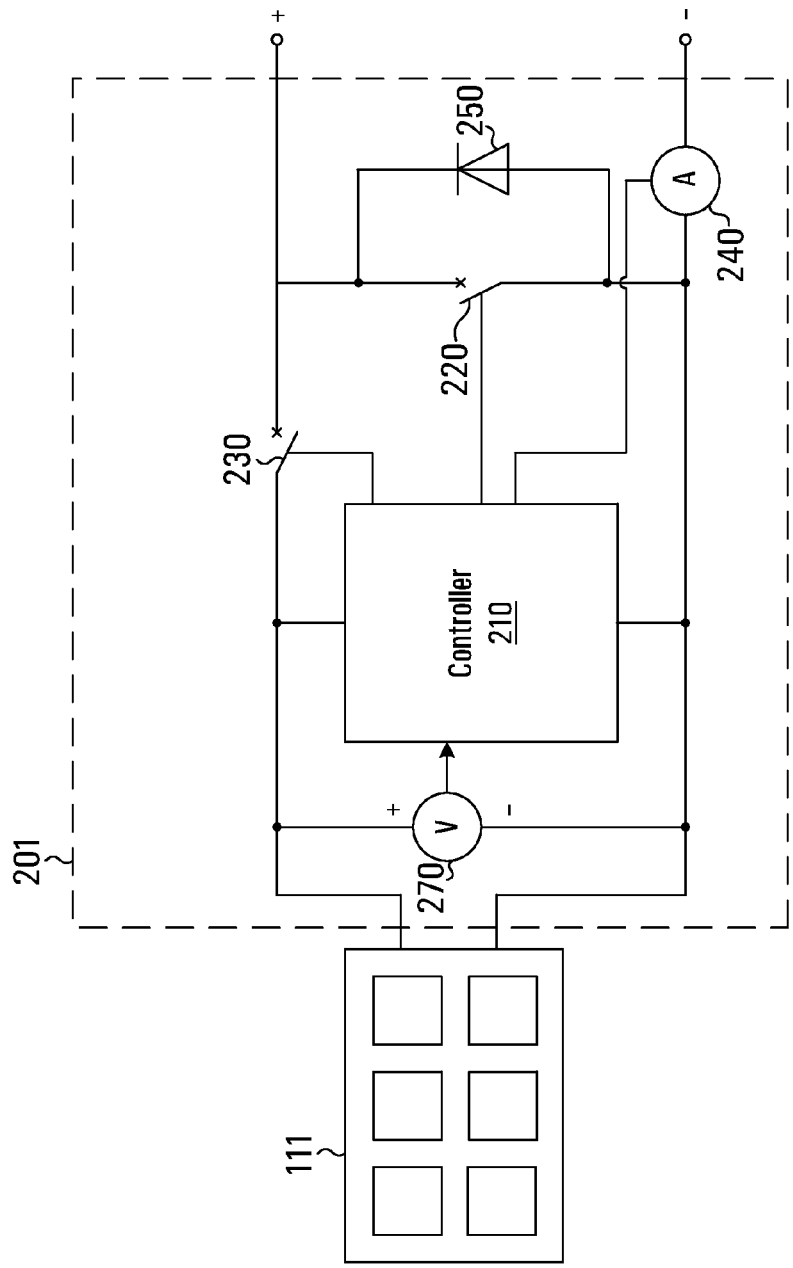
FIG. 2C is a schematic diagram of one embodiment of an Intelligent Safety Disconnect Switch (ISDS).

FIG. 2C is a schematic diagram of one embodiment of an ISDS. In the embodiment shown, ISDS 201 includes a controller 210, shunt switch 220, series switch 230, current sensor 240 such as an ammeter, diode 250, and voltage sensor 270 such as a voltmeter, interconnected as shown. The other ISDSs 202, 203 in FIG. 2A may have a similar structure.

Switches 220 and 230 could be implemented using any of a variety of means, including but not limited to: power Metal Oxide Semiconductor Field Effect Transistors (MOSFETs), Insulated Gate Bipolar Transistors (IGBTs), Thyristors, and/or relays, for example. Diode 250 is in parallel with switch 220. Diode 250 allows string current to flow in the event that PV panel 111 cannot supply sufficient power to operate controller 210. In this situation controller 210 would be unable to supply drive voltage to switch 220 and keep it closed, however current can still flow through diode 250 to bypass the panel 111. Under conditions where the controller 210 has sufficient power to drive the switch 220, the closed switch dissipates less power than the diode 250.

Current sensor 240 monitors the string current. Controller 210 draws its power from PV panel 111 and receives a current measurement from current sensor 240. Controller 210 controls the operation of switches 220 and 230. In some embodiments current sensor 240 is a part of controller 210.

The voltage sensor 270 is an optional component, connected to the output of PV panel 111 in some embodiments for monitoring the PV panel output voltage.

Figure 3B:
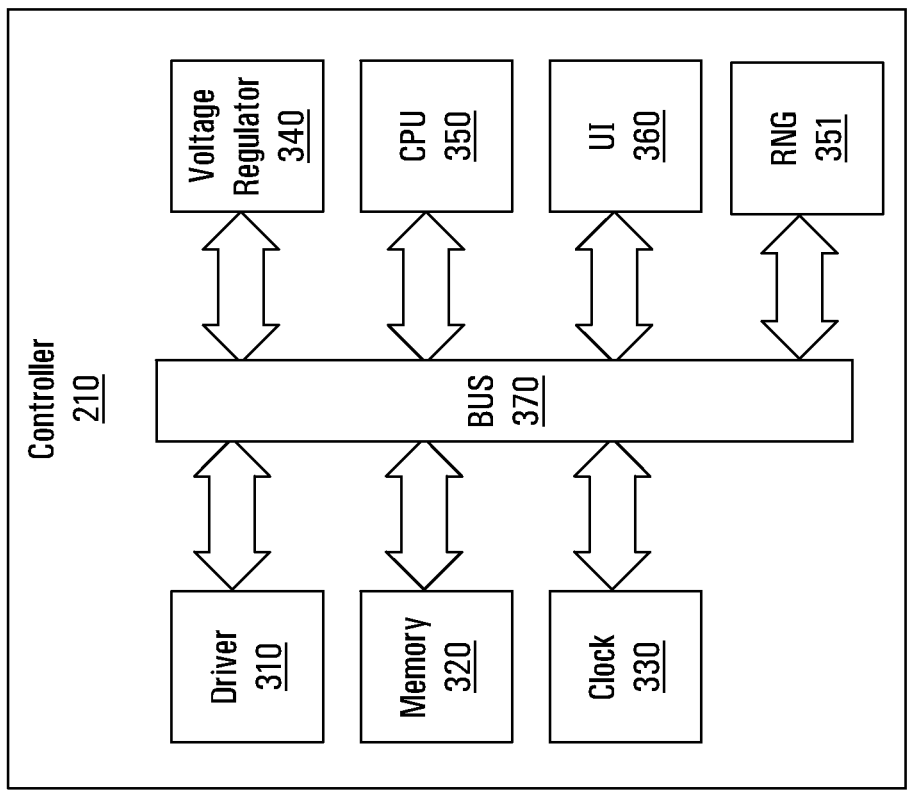
FIG. 3B is a block diagram of another embodiment of a controller.
Figure 3A:
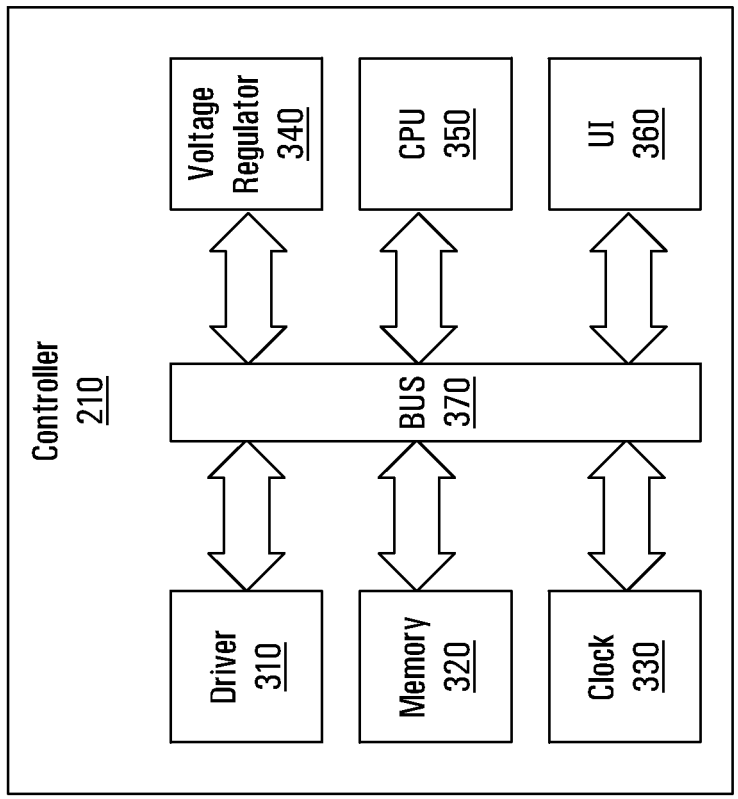
FIG. 3A is a block diagram of one embodiment of a controller.

FIG. 3A is a block diagram of one embodiment of a controller 210. Voltage regulator 340 converts variable PV panel output voltage to a constant controller supply voltage in an embodiment. Driver 310 supplies drive signals to switches 230 and 220 to control their opening and closing. Firmware for the operation of the example controller 210 is stored in memory 320. In one embodiment, memory 320 is non-volatile memory such as Flash, Electrically Erasable Programmable Read Only Memory (EEPROM), EPROM, ROM. The firmware is executed on Central Processing Unit (CPU) 350. Clock 330 controls the internal timing of the controller operation. User Interface (UI) 360 indicates the status of the ISDS to a user. Control and data bus 370 interconnects these components with each other as shown, in an embodiment.

In one embodiment, the UI 560 includes a Light Emitting Diode (LED) that indicates the state of the ISDS (connected or disconnected). It may indicate the ISDS state by its illumination state (on or off) or by its color (green or red), for example. In one embodiment, it indicates the detection of an arc fault. In one embodiment, UI 360 contains a manual switch. In one embodiment, the manual switch is a reset switch which initiates a manual reconnect of the ISDS. In one embodiment, the manual switch initiates a manual reconnect of the ISDS after an arc fault. In one embodiment, UI 360 allows for the programming of timing parameters such as a reconnect delay after a disconnect and/or a wait or a delay time. In one embodiment, the manual switch is a test switch which initiates testing of an arc detection function.

FIG. 3B is a block diagram of another embodiment of a controller. In this embodiment controller 210 contains a random number generator (RNG) 351. The RNG could be usefully employed to generate random delays and wait times for some operations.

Disconnect Operations

Referring again to FIG. 2C, when PV panel 111 is illuminated and there is string current flowing, shunt switch 220 of the example ISDS 201 is open and series switch 230 is closed. The PV panel 111 is in series with the other panels in the panel string and contributes to the string voltage and current.

In the event of an open circuit or high resistance condition in the string, the string current falls to substantially zero. This loss of current is detected by controller 210 using current sensor 240. Controller 210 opens series switch 230 and disconnects the PV panel 111 from the string. Controller 210 also closes shunt switch 220, thereby maintaining the electrical continuity of the string at the PV panel 111's point of connection. With series switch 230 open, maintenance and emergency workers are safely protected from the output of the PV panel 111.

In another embodiment, controller 210 monitors current sensor 240 for the presence of an arc fault in the string. An arc fault is large and undesired current flow between the string and ground or between different conductors in the string and may occur when the insulation of the string wiring or string connectors fails or when the string is accidentally severed. Arc faults can lead to electrification of a PV panel mounting system, serious damage to equipment, fire, and/or injuries to personnel. In one embodiment, controller 210 monitors current sensor 210 for the presence of an arc fault current. On detection of an arc fault, controller 210 disconnects the PV panel 111 from the string by opening series switch 230 and closing shunt switch 220. With switch 220 closed the PV panel is bypassed and the output voltage of the PV panel does not contribute to the arc fault.

Arc fault detection could be in accordance with any of various techniques. Some arc fault detection methods involve spectral analysis of the string current or voltage for an arc "signature". In one embodiment, the controller 210 contains a Digital Signal Processor (DSP) to facilitate the spectral analysis.

In some situations the simultaneous disconnection of all panels in a string and the closing of their shunt switches may create undesirably large currents due to the discharge of the inverter's input capacitance through the low resistance closed shunt switches. In one embodiment ISDSs 201, 202, 203 each wait for a randomly chosen wait time after sensing a disconnect condition such as an arc fault or a loss of string current before disconnecting respective PV panels 111, 112, 113 from the string. This ensures a gradual disconnection of panels 111, 112, 113 and a smaller peak discharge current.

Reconnect Operations

After an ISDS has isolated its PV panel from the string, it could check to determine whether the PV panel can be safely reconnected to the string, illustratively by checking for DC continuity in the panel string circuit.

In one embodiment of a reconnect operation, the controller 210 monitors the string current using current sensor 240. If the DC value of the string current $I_{STRING}$ is equal to or above a minimum DC current value $I_{MIN}$ then this is interpreted as electrical continuity in the string and the example ISDS 201 reconnects the PV panel 111 to the string by opening shunt switch 220 and closing series switch 230. If $I_{STRING}$ is below $I_{MIN}$ then the example ISDS 201 keeps the PV panel 111 disconnected.

In another embodiment of a reconnect operation after detection of an arc fault the example ISDS 201 reconnects the panel 111 to the string when it receives a reset signal through user interface 360. The reset signal need not be a locally generated reset signal, and could instead be sent from a remote source.

In another embodiment of a reconnect operation, the example ISDS 201 performs an electrical continuity check on the string. The controller 210 applies a test voltage from the PV panel 111 to the string and receives a measurement of the resulting string current from the current sensor 240. For safety, it might be desirable to limit the test voltage magnitude and its duration on the string.

Figure 4:
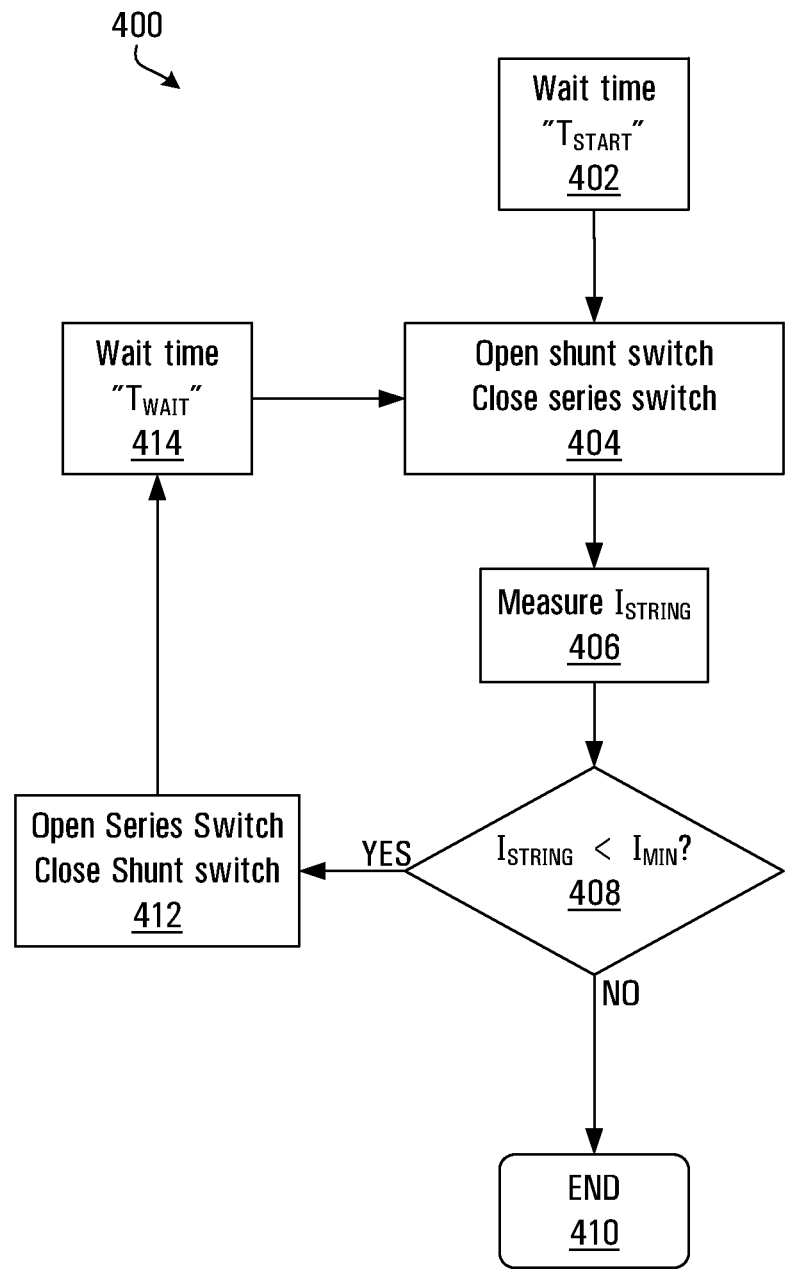
FIG. 4 is a flow diagram of an example reconnect operation.

FIG. 4 is a flow diagram of an example reconnect operation or method 400, with electrical continuity checking. After an ISDS has isolated its PV panel, controller 210 (FIG. 2C) waits for time interval "$T_{START}$" at 402 and then opens shunt switch 220 and closes series switch 230 at 404, which applies the PV panel 111 voltage to the string. In one embodiment, $T_{START}$ is the inverter minimum anti-islanding wait time of the inverter 120 (FIG. 2A), as mandated by an electrical grid authority, for example. The controller 210 (FIG. 2C) measures the string current $I_{STRING}$ resulting from the PV panel 111 voltage at 406, using current sensor 240. If the DC value of $I_{STRING}$ is below a minimum DC current value INN as determined at 408, then this is interpreted as an absence of electrical continuity in the string. Controller 210 then re-isolates the PV panel 111 by opening series switch 230 and closing shunt switch 220 at 412. The controller 210 waits for a time period $T_{WAIT}$ at 414 and then repeats the cycle.

If, however, the measured string current $I_{STRING}$ is equal to or above the minimum DC value $I_{MIN}$ as determined at 408, then controller 210 ends this cycle or control loop at 410 and maintains series switch 230 closed and shunt switch 220 open. In one embodiment, the remaining ISDSs in the string monitor the string current and also reconnect to the string once they sense the string current.

In one embodiment $T_{START}$ and $T_{WAIT}$ are identical values and are stored in the controller memory 320 (FIGS. 3A, 3B).

Single Probabilistic Reconnect

In another embodiment, $T_{START}$ is a random value generated by the controller 210 and is between an upper bound ($T_{MAX}$) and a lower bound ($T_{MIN}$). In some embodiments, $T_{MIN}$ may correspond to a minimum anti-islanding waiting time. In some embodiments, $T_{MAX}$ might be equal to the sum of $T_{MIN}$ and $T_{WAIT}$. In this embodiment, all ISDSs in a string could have identical values of $T_{WAIT}$. The randomized start times in this embodiment avoid the situation of multiple switches attempting to reconnect to the string simultaneously, which might create undesirably large voltages on the string. In this embodiment, the ISDS with the smallest value of "$T_{START}$" is the first ISDS to attempt a reconnect followed by the ISDS with the next smallest value of $T_{START}$ and so on in sequence according to values of $T_{START}$ until all ISDSs have attempted a reconnect. The cycle repeats with a period of $T_{WAIT}$. This is referred to herein as a Single Probabilistic Reconnect.

Single Deterministic Reconnect

In another embodiment, the $T_{START}$ values of the N ISDSs for a string of N PV panels are all different and are programmed into an ISDS memory such as the controller memory 320 (FIGS. 3A, 3B). In one embodiment, the start time of the i-th ISDS ($T_{START,i}$) is chosen according to the formula:

$$T_{START,i} = T_{START,1} + (i-1) \times \frac{T_{WAIT}}{N}$$

In this embodiment, reconnect attempts are made at regular intervals of $T_{WAIT}/N$ beginning at a time $T_{START,1}$ after disconnect. This is referred to herein as a Single Deterministic Reconnect.

Multiple Deterministic Reconnect

In some inverter designs, the voltage of a single PV panel might not be sufficiently large to cause an inverter to operate after the PV installation has been reconnected to the grid. An inverter normally requires a minimum input voltage $V_{START}$ to begin operation. If the voltage of a single PV panel is less than $V_{START}$ when its ISDS attempts a reconnect, then the inverter might not operate. The ISDS might then disconnect since the detected string current could be below $I_{MIN}$ due to inverter impedance. For some inverter designs, multiple ISDSs attempt to reconnect simultaneously to generate a sufficient inverter input voltage such that the inverter will operate and string current will flow.

Thus, in another embodiment, groups of ISDSs in a string are assigned identical values of $T_{START}$ such that all ISDSs in the group will attempt to reconnect simultaneously. This is referred to herein as a Multiple Deterministic Reconnect. The number of ISDSs in the group is chosen to meet the start-up voltage of the inverter. For example, if a minimum of three PV panels in a string would generate a string voltage sufficient for an inverter to operate, then a minimum of three ISDSs are assigned identical values of $T_{START}$. The starting time for the j-th group could be assigned according to the formula below, where M is the number of groups $$T_{START,j} = T_{START,1} + (j-1) \times \frac{T_{WAIT}}{M}$$

Multiple Probabilistic Reconnect

In some situations the clocks of the ISDSs might not be synchronized. For example, a PV panel might not be able to generate enough power to keep the controller 210 of the example ISDS 201 (FIG. 2C) working during the night time. In the morning, when the PV panels begin to generate sufficient power to operate their controllers, the clocks 330 (FIGS. 3A, 3B) of the different controllers in a string of PV panels might not be synchronized, since each PV panel could power up its controller at a slightly different time. In this circumstance, it could be difficult to control the ISDSs such that a sufficient number of PV panels to supply the inverter start-up voltage are connected to the string simultaneously.

Figure 5:
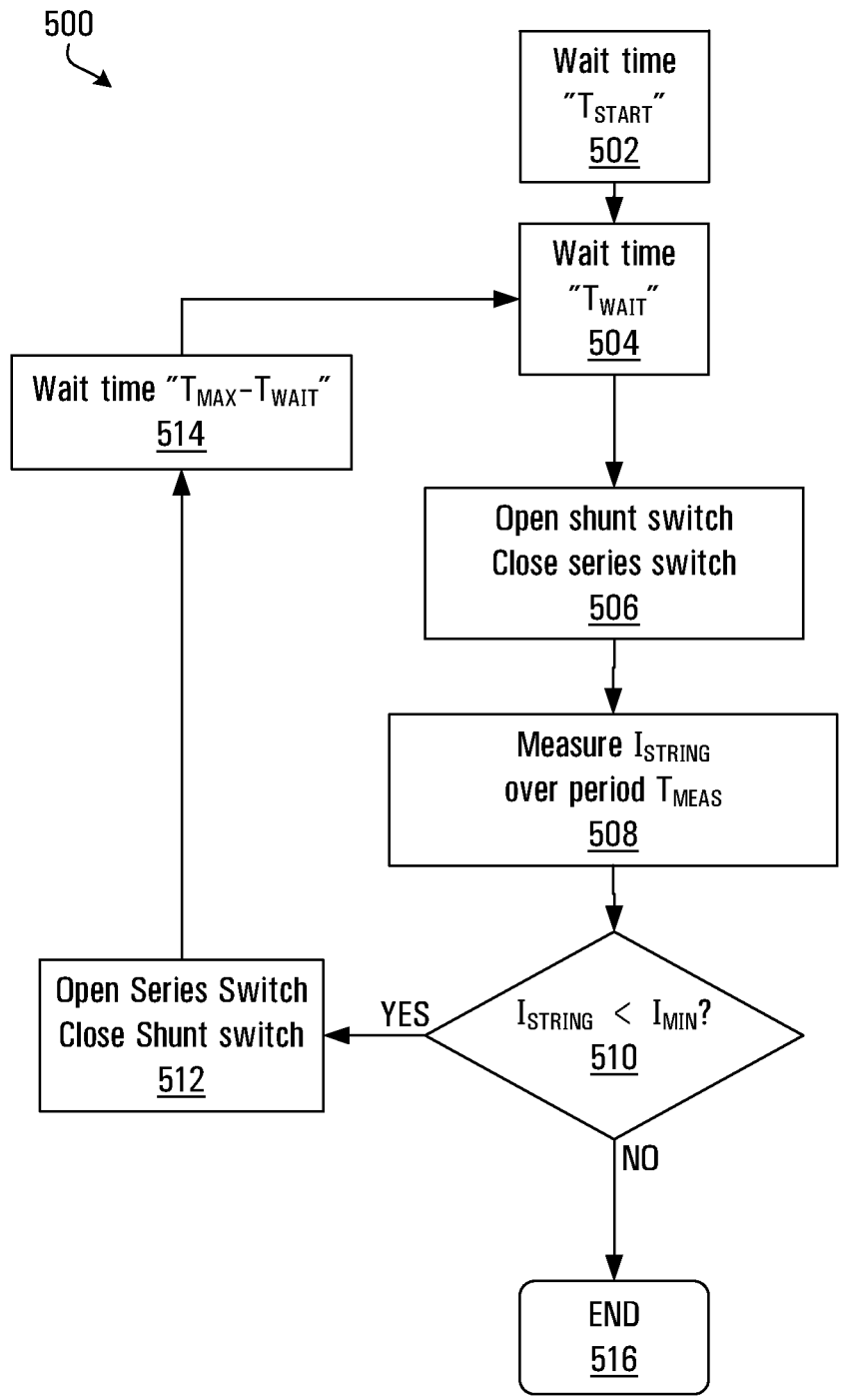
FIG. 5 is a flow diagram of another embodiment of a reconnect operation.

FIG. 5 is a flow diagram of another embodiment of a reconnect operation or method 500. This embodiment is referred to herein as a Multiple Probabilistic Reconnect and could be used in the case of unsynchronized controller clocks, for example. In this embodiment all ISDS controllers wait for a time $T_{START}$ at 502 after they have disconnected or have been powered up. In some embodiments, $T_{START}$ corresponds to the minimum anti-islanding wait time mandated by the electrical grid authority.

After $T_{START}$ has expired at 502, a controller waits a further time $T_{WAIT}$ at 504 and then connects its PV panel to the string by opening its shunt switch 220 (FIG. 2C) and closing its series switch 230 at 506. It maintains these switch positions for a time $T_{MEAS}$ during which $I_{STRING}$ is measured at 508. If the DC value of the string current $I_{STRING}$ is less than $I_{MIN}$ as determined at 510 in this example, then the controller disconnects the PV panel at 512 by opening series switch 230 and closing shunt switch 220. The ISDS then waits a further time $T_{MAX}-T_{WAIT}$ at 514 and the cycle repeats. If the DC value of the string current $I_{STRING}$ is equal to or above $I_{MIN}$ as determined at 510 then controller 210 ends the reconnect operation at 516 with series switch 230 closed, shunt switch 220 open and the PV panel connected.

In this embodiment, the value of $T_{WAIT}$ is a random value between zero and an upper bound $T_{MAX}$. Values of $T_{MAX}$ and $T_{MEAS}$ could be chosen such that the probability of multiple ISDSs and their respective panels being simultaneously connected to the string and generating the inverter start-up input voltage is sufficiently high to meet an operational objective, for example.

For a single cycle of period $T_{MAX}$ the probability "P" of "n" ISDSs connecting simultaneously to the string is $$P = 1 - \exp\left[-\frac{\binom{N_{STRING}}{n}}{\left(\frac{T_{MAX}}{T_{MEAS}}\right)^{n-1}}\right]$$

where $N_{STRING}$ is the number of ISDSs in the string. For a string of 20 PV panels in which 4 PV panels are to connect in order to start the inverter, a $T_{MEAS}$ of 1 second (s) and a $T_{MAX}$ of 10 s yields a probability of 99% that four PV panels will be connected simultaneously.

A DC string current will flow once the minimum number of PV panels have connected if there is continuity in the string circuit. The measured DC string current $I_{STRING}$ would then be above the minimum DC value $I_{MIN}$ as determined at 510, and controller 210 exits the cycle or control loop at 516 and maintains series switch 230 closed and shunt switch 220 open. The remaining ISDSs in the string then sense the string current and connect their PV panels.

Current Pulse Reconnect

In another embodiment of the reconnect operation the input impedance of the inverter is usefully employed. The input impedance of an inverter is substantially capacitive when applied voltage is below the start voltage. When a PV panel reconnects to the string, a current pulse will flow as this input capacitance is charged by the PV panel as long as the string is connected to the inverter input and there are no breaks in the string. In one embodiment a PV panel reconnects long enough to charge the inverter capacitance to substantially the panel voltage. In another embodiment a PV panel reconnects only long enough to partially charge the capacitance to a fraction of the panel voltage.

The current pulse from charging of the inverter input capacitance can be usefully employed to verify that a string is physically continuous and connected to the inverter input, and/or as a communication means between ISDSs on a string. Thus, in one embodiment of the reconnect operation, controller 210 in the example ISDS 201 in FIG. 2C connects PV panel 111 to the string and monitors its current sensor 240 for a characteristic current pulse from the charging of the inverter capacitance to verify that the string is continuous and connected to the inverter 120. The ISDS controller 210 may also monitors the string for current pulses generated by other ISDSs, as they connect their respective PV panels, to track the number of connected ISDSs. This is referred to herein as Current Pulse Reconnect.

Figure 6A:
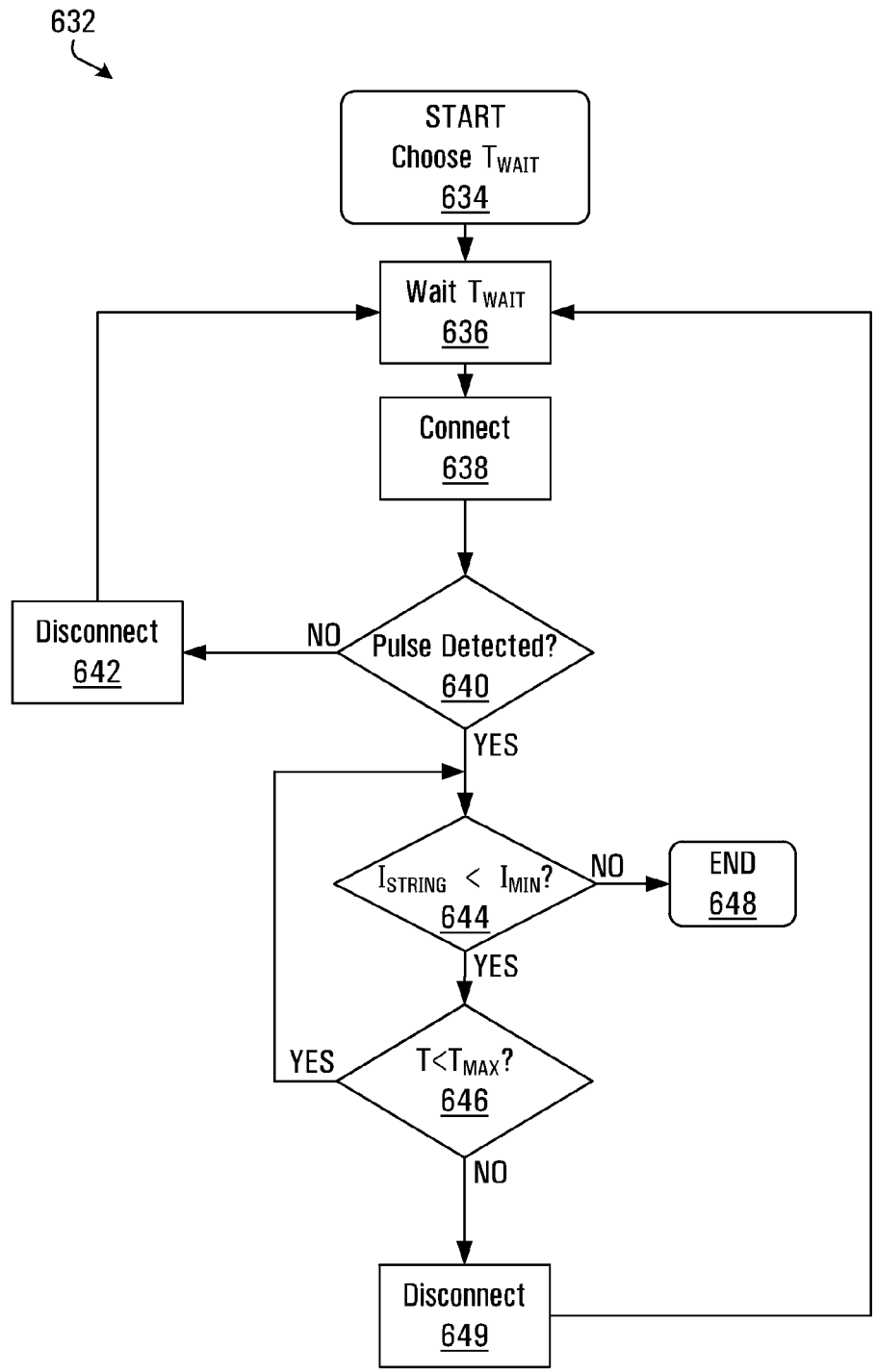
FIG. 6A is a flow diagram of an example reconnect operation using current pulses.

FIG. 6A is a flow diagram of an example reconnect operation or method 632 using current pulses. In this embodiment, after a disconnect or after power-up in the morning, for example, an ISDS chooses a wait time $T_{WAIT}$ at 634. The ISDS waits until the expiration of $T_{WAIT}$ as determined at 636. In one embodiment, $T_{WAIT}$ is generated randomly by the ISDS. This may reduce the likelihood of two ISDSs connecting simultaneously and generating overlapping pulses. In this embodiment controller 210 in the example ISDS 201 in FIG. 2C connects PV panel 111 to the string at 638 by opening bypass switch 220 and closing series switch 230 and monitors its current sensor 240 for a characteristic current pulse from the charging of the inverter capacitance at 640. If no pulse is detected at 640 the ISDS disconnects the PV panel at 642 by opening series switch 230 and closing shunt switch 220 and returns to its waiting state 636. If a pulse is detected at 640 the ISDS waits for a maximum time of $T_{MAX}$ for the DC string current to meet or exceed a minimum value $I_{MIN}$. If $I_{STRING}$ is greater than or equal to $I_{MIN}$ as determined at 644 the reconnect operation ends at 648. If $I_{STRING}$ has not met or exceeded $I_{MIN}$ by the time $T_{MAX}$ expires, as determined at 646, the ISDS disconnects the PV panel at 649 and returns to the wait state at 636.

Gradual Reconnect with Current Pulses

Figure 6B:
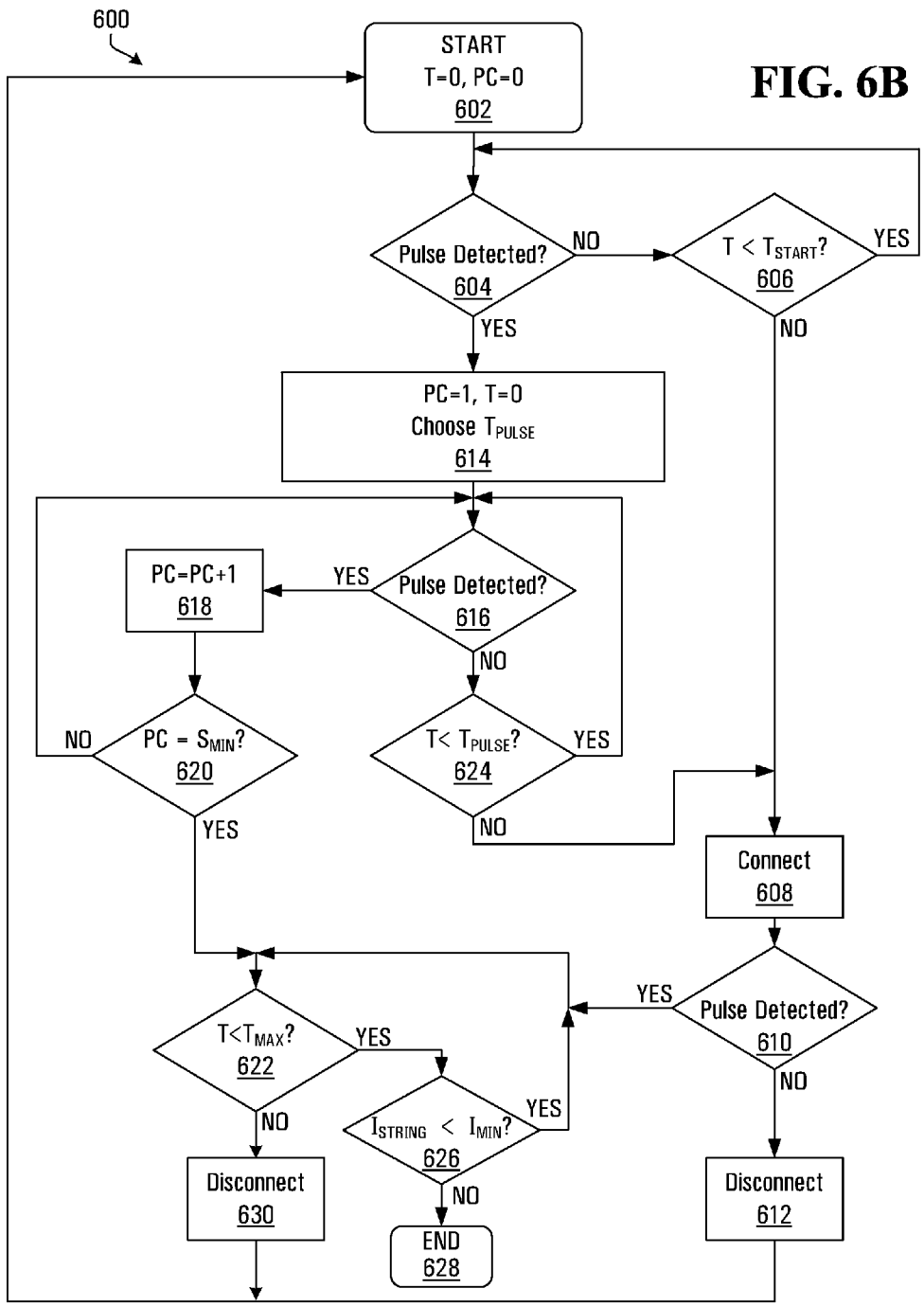
FIG. 6B is a flow diagram of a further example reconnect operation using current pulses.

FIG. 6B is a flow diagram of an example reconnect operation or method 600 using current pulses. In this embodiment, after a disconnect or after power-up in the morning, for example, an ISDS first sets its pulse count (PC) and timer (T) to zero at 602 and then waits for a time $T_{START}$. In one embodiment the ISDS measures the PV panel voltage prior to beginning a reconnect operation and will not commence a reconnect operation until the PV panel voltage is above a threshold value. This may ensure that a current pulse of sufficient magnitude for detection can be produced. In one embodiment, $T_{START}$ is generated randomly by the ISDS. This may reduce the likelihood of two ISDSs connecting simultaneously and generating overlapping pulses. In one embodiment, $T_{START}$ is always chosen to be long enough such that, if the ISDS is the first ISDS to power up in the morning, the remaining ISDSs in the string will have also powered up before $T_{START}$ expires.

During the waiting period $T_{START}$ the ISDS monitors the string at 604 for a current pulse from any other ISDS on the string reconnecting. Any of various pulse detection methods could be used. In one embodiment, the output of the current sensor 240 (FIG. 2C) is digitized by an analog to digital converter in the controller 210 and compared to a stored pulse profile.

If no pulse has been detected at 604 when the $T_{START}$ waiting period expires (as determined at 606), then the ISDS reconnects its PV panel to the string at 608 by opening bypass switch 220 and closing series switch 230 and monitors for the current pulse generated from its own reconnection. If no pulse is detected at 610, it means that there is no physical continuity in the string, the string is not connected to the inverter, or the ISDS did not generate a pulse with the correct characteristics to be detected. In all cases the ISDS disconnects at 612 by closing bypass switch 220 and opening series switch 230. If an ISDS cannot generate a pulse with the correct characteristics to be detected by its own controller, then it is unlikely that the pulse can be detected by other ISDSs on the string. The ISDS should therefore disconnect. The correct characteristics of a pulse to be detected may include, for example, a current magnitude, a current rise time, a rate of current increase, a rate of current decrease and/or a pulse width.

If a pulse is detected at 610, then the ISDS remains connected and becomes the first connected ISDS. The first connected ISDS will then wait for a time $T_{MAX}$ for the DC string current $I_{STRING}$ to meet or exceed $I_{MIN}$. If the DC string current meets or exceeds $I_{MIN}$ as determined at 626 the operation terminates at 628. If the time exceeds $T_{MAX}$ as determined at 622 then the ISDS disconnects at 630 by closing bypass switch 220 and opening series switch 230 and the operation restarts at 602.

If a pulse is detected at 604 during the $T_{START}$ waiting period, then the pulse counter is set to a value of one, the timer is reset to zero and a random second wait time ($T_{PULSE}$) is generated, at 614. The ISDS monitors the string for additional current pulses over the second waiting period $T_{PULSE}$. In this embodiment $T_{PULSE}$ is a random value between zero and $T_{MAX}$. $T_{MAX}$ is chosen such that the probability of two switches connecting simultaneously and generating overlapping current pulses before the minimum number of switches has connected is low. The generation of overlapping current pulses might cause a miscounting of the number of connected switches. If a current pulse has a width of W and the operation terminates once the number of connected switches reaches $S_{MIN}$ then the probability "P" of two overlapping pulses occurring over the time period $T_{MAX}$ is given by the formula $$P = 1 - \exp\left[-\frac{S_{MIN}^2}{2\left(\frac{T_{MAX}}{W}\right)}\right]$$

For example, if $S_{MIN}$ is 4, W is 1 millisecond and $T_{MAX}$ is 1 second then P=0.8%.

The pulse counter is incremented at 618 when an additional current pulse is detected at 616 within the time period $T_{PULSE}$, and the incremented pulse counter is compared at 620 to the minimum number of connected switches ($S_{MIN}$). If the pulse counter has reached the minimum value as determined at 620, then the minimum number of ISDSs and PV panels are now connected to the string and the ISDS should not yet attempt to connect. The ISDS therefore waits at 622 until the timer reaches $T_{MAX}$ or the string current $I_{STRING}$ reaches the minimum value $I_{MIN}$. During $T_{MAX}$, if the string current $I_{STRING}$ meets or exceeds $I_{MIN}$ as determined at 626, then the ISDS may connect (since $I_{STRING}$ is now at or above $I_{MIN}$) and the operation terminates at 628.

If the minimum pulse count has not been exceeded at the end of the $T_{PULSE}$ waiting period, which is detected at 624, then the ISDS connects to the string at 608, and as described above monitors for a current pulse generated from its connection to the string, at 610. If no pulse is detected, then the ISDS disconnects at 612. If a pulse is detected then the ISDS remains connected and will then wait for a time $T_{MAX}$ for the DC string current $I_{STRING}$ to meet or exceed $I_{MIN}$. If the DC string current meets or exceeds $I_{MIN}$ as determined at 626 the operation terminates at 628. If the time exceeds $T_{MAX}$ as determined at 622 then the ISDS disconnects at 630 and the operation restarts at 602.

In this embodiment, there is a minimum number of connected switches ($S_{MIN}$). The string voltage gradually increases as more ISDSs connect. This embodiment is referred herein to as Gradual Reconnect with Current Pulses. $S_{MIN}$ corresponds to the minimum number of PV panels to produce the start-up voltage for the inverter in an embodiment. In this way, string voltage is kept to the minimum value to start the inverter, until the inverter starts up. In this embodiment ISDSs connect to the string one by one.

Although not shown in FIG. 6B, all ISDSs continue to monitor the string current for a minimum value of DC current indicative of the start-up of the inverter during the entire operation. An ISDS will end the operation and connect to the string if it detects a DC string current greater than the minimum value.

Simultaneous Reconnect with Pulses

Some inverters could have minimum starting voltages that are hazardous. In this situation, and in order to reduce hazards to personnel, the amount of time that the string is energized during a reconnect attempt could be minimized.

In another embodiment of the reconnect operation, the PV panels that supply the inverter start-up voltage reconnect to the string simultaneously rather than one by one as in the Gradual Reconnect with Current Pulses embodiment. This embodiment is referred to herein as Simultaneous Reconnect with Pulses. In this embodiment, an ISDS momentarily connects to the string to determine whether the string is physically continuous and connected to the inverter. If physical continuity is established, then the status of the ISDS is set to "READY", indicating that it is ready to participate in a reconnect operation. When a sufficient number of ISDSs are "READY", the "READY" ISDSs all connect to the string substantially simultaneously. The connected ISDSs measure the DC string current. If the current is greater than the minimum value, then the ISDSs remain connected. Otherwise, they all disconnect and the reconnect operation terminates. In this embodiment, the duration of any high string voltage can be minimized to only the time it takes to establish a DC current.

Figure 6C:
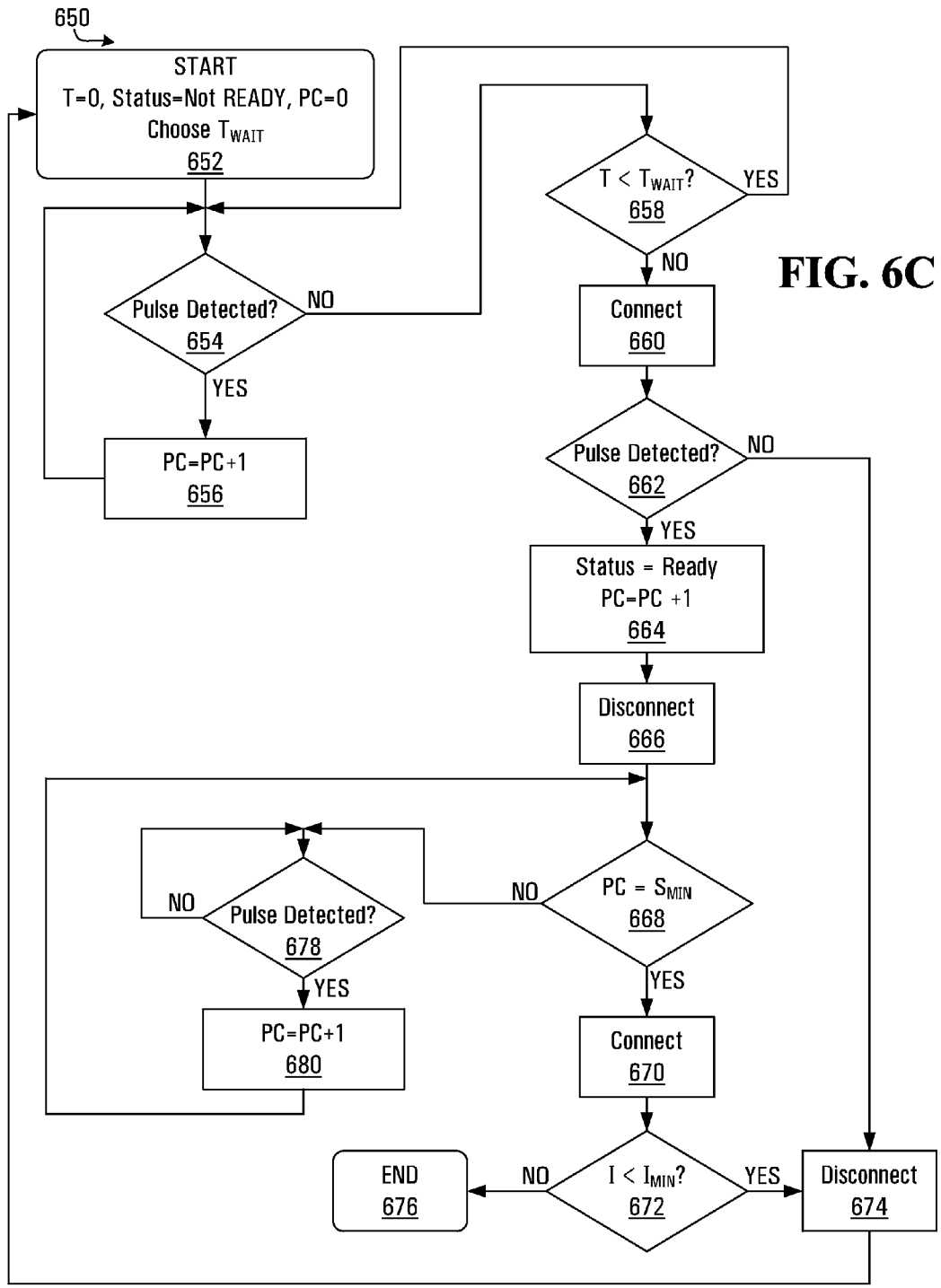
FIG. 6C is a flow diagram of another example reconnect operation using current pulses.

FIG. 6C is a flow diagram of another example reconnect operation using current pulses, which represents an embodiment of the Simultaneous Reconnect with Pulses.

In the example reconnect operation or method 650, after a disconnect or after power-up an ISDS first sets its pulse count (PC) and timer (T) to zero and sets its status to "Not READY" at 652 and chooses a waiting time $T_{WAIT}$. In one embodiment $T_{WAIT}$ is generated randomly by the ISDS between zero and a maximum value $T_{MAX}$. In one embodiment, the ISDS may also measure the PV panel voltage prior to beginning a reconnect operation and not commence a reconnect operation until the PV panel voltage is above a threshold value which ensures that a current pulse of measurable magnitude can be produced.

In the embodiment shown in FIG. 6C, the ISDS waits for a time $T_{WAIT}$. During the waiting period $T_{WAIT}$ the ISDS monitors the string for a current pulse from any other ISDS on the string reconnecting. If a pulse is detected at 654, then the ISDS increments the pulse counter at 656.

Once the $T_{WAIT}$ waiting period expires, as detected at 658, the ISDS momentarily connects to the string at 660 by opening bypass switch 220 and closing series switch 230 and looks for the current pulse generated from its connection to the string, at 662. If a pulse is detected, then it means that the ISDS is connected to the inverter output. The ISDS's status is changed to READY and the pulse counter is incremented at 664. The ISDS then disconnects at 666 by closing bypass switch 220 and opening series switch 230. In the example ISDS shown in FIG. 2C, the disconnect involves opening series switch 230 and closing shunt switch 220. The closing of shunt switch 220 will discharge the capacitance of the inverter input. This allows the inverter input capacitance to be charged by the next ISDS connecting to the string and a pulse to be generated.

The ISDS next checks the state of the pulse counter at 668. If the pulse counter is equal to the $S_{MIN}$ then the minimum number of ISDSs ($S_{MIN}$) to provide the inverter start-up voltage are ready to connect, then the ISDS connects to the string at 670 by opening bypass switch 220 and closing series switch 230. The DC component of the string current is then measured and evaluated at 672. If the current is below the minimum value ($I_{MIN}$), then the ISDS disconnects at 674 by closing bypass switch 220 and opening series switch 230 and the operation restarts at 652. If the DC string current is equal to or greater than $I_{MIN}$ it remains connected and exits the reconnect process at 676.

If the pulse counter is less than $S_{MIN}$ as determined at 668, then this indicates there are not enough ISDSs ready to reconnect. The ISDS will continue to listen for pulses in the string at 678. If additional pulses are detected, then the pulse counter is incremented at 680 and re-evaluated at 668.

As in the previous embodiment, the generation of overlapping pulses could result in a miscount of the number of ISDSs that are ready to connect. $T_{MAX}$ might therefore be chosen such that the probability of two switches connecting simultaneously and generating overlapping current pulses before the minimum number of switches are READY is low.

Simultaneous Probabilistic Reconnect

In another embodiment, after a first pulse is detected, the remaining ISDSs are connected to the string by selection of a random number. This method is referred to herein as Simultaneous Probabilistic Reconnect. In this method, after a first pulse is detected in the $T_{START}$ period, the remaining ISDSs each generate a random number between 0 and 1. If the ISDS's random number is less than or equal to a predefined value "p", then that ISDS will connect to the string. If the random number is greater than p, then it does not connect. The probability P(n) that "n" out of the remaining N−1 unconnected ISDSs will connect is given by the binomial distribution $$P(n) = \binom{N-1}{n} p^n (1-p)^{N-n-1}$$

The probability that n or more ISDSs will connect is given by the cumulative distribution function $$P(n) = \sum_{k=n}^{N-1} \binom{N-1}{k} p^k (1-p)^{N-k-1}$$

Thus, a value of "p" can be chosen to provide for a desired probability P(n) of connection of at least "n" ISDSs.

Communication

Figure 7:
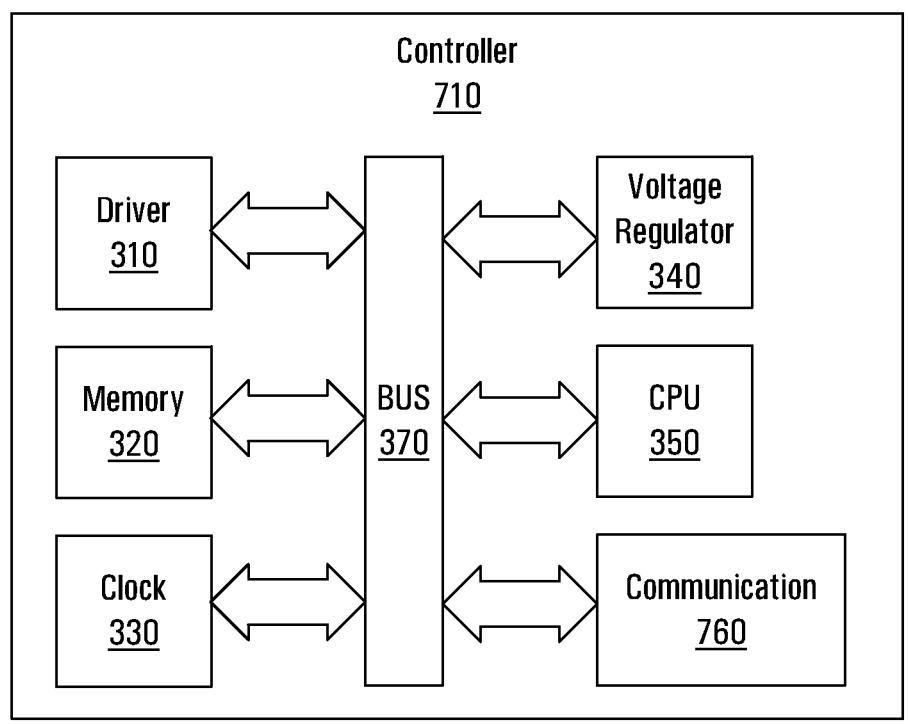
FIG. 7 is block diagram of another embodiment of a controller.

FIG. 7 is block diagram of another embodiment of a controller. In this embodiment, controller 710 contains communication means or module 760. In one embodiment, communication means or module 760 is wireless communication means such as a Wi-Fi or Bluetooth module. In one embodiment, communication means or module 760 supports mesh style communication in which signals pass through multiple ISDSs between origin and destination. In another embodiment, communication means or module 760 is a wired communication means such as a Powerline communications module, and communication is through the string wiring. In another embodiment, communication is through dedicated wiring such as optical fiber or twisted pair.

In one embodiment, the reconnect operation is controlled through the communication means or module 760. In this embodiment, a reconnect command could be received by the example ISDS controller 710 through communication means or module 760, and cause the ISDS to open its shunt switch 220 (FIG. 2C) and close its series switch 230. In one embodiment, the reconnect command is sent by a grid sensor which senses the reconnection of the output of the inverter to the electrical grid.

Figure 8:
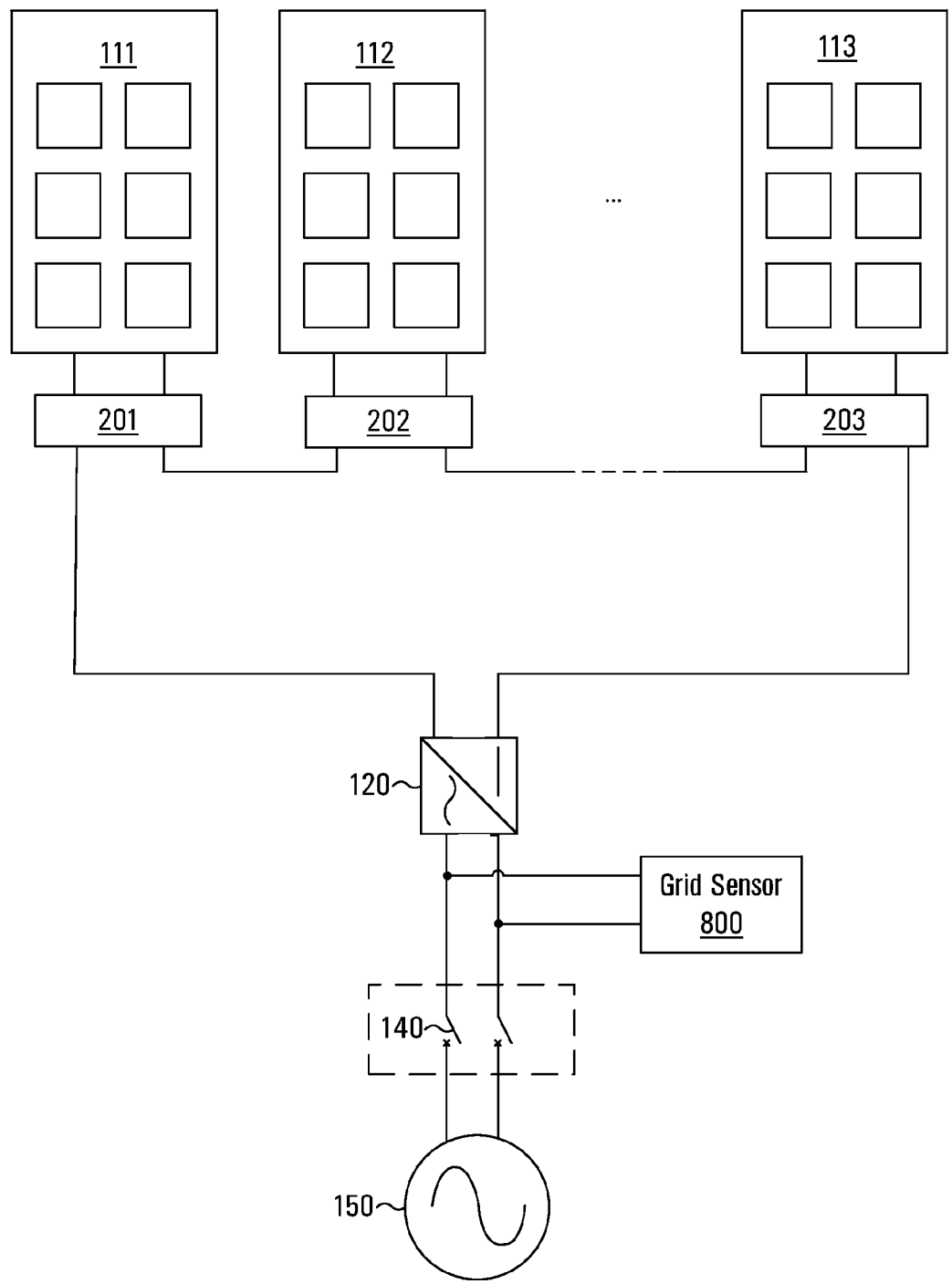
FIG. 8 is a block diagram of an example PV installation with a grid sensor.

FIG. 8 is a block diagram of an example PV installation with a grid sensor. Grid sensor 800 is connected to the output of inverter 120 and senses whether inverter 120 is connected to grid 150. When the grid sensor 800 detects that the inverter 120 is no longer connected to the grid 150, it sends a disconnect command to ISDSs 201, 202 and 203. Similarly, when the grid sensor 800 detects that the inverter 120 is again connected to the grid 150, it sends a reconnect command to the ISDSs 201, 202, 203.

In one embodiment, the grid sensor 800 measures the AC voltage at the output of the inverter 120 and before disconnect switch 140. In this embodiment, when the inverter 120 is disconnected from the grid 150 by the opening of disconnect switch 140 the inverter will automatically enter anti-islanding mode and its AC output voltage will drop to substantially zero. The drop in output voltage is detected by the grid sensor 800. The grid sensor 800 then sends a disconnect command to ISDSs 201, 202 and 203 and they disconnect their PV panels 111, 112, 113 from the string. In one embodiment, a disconnect command is sent if the AC output voltage of the inverter 120 drops below a minimum grid voltage specified by the grid authority.

When the inverter 120 is reconnected to the grid 150 by closing of grid disconnect switch 140 the AC grid voltage will be sensed by the grid sensor 800. When the grid sensor 800 senses a grid voltage greater than a minimum value, it will send a reconnect command to ISDSs 201, 202 and 203. In one embodiment, all PV panels 111, 112, 113 in the string receive the reconnect command and reconnect to the string. In another embodiment, only the minimum number of panels to start the inverter 120 reconnect. In one embodiment, the minimum AC voltage is the minimum AC grid voltage specified by the grid authority. In one embodiment, the grid sensor 800 instructs the ISDSs to remain connected for a minimum waiting period. In one embodiment, this waiting period exceeds the grid mandated anti-islanding waiting time of the inverter 120.

Grid Sensor

Figure 9:
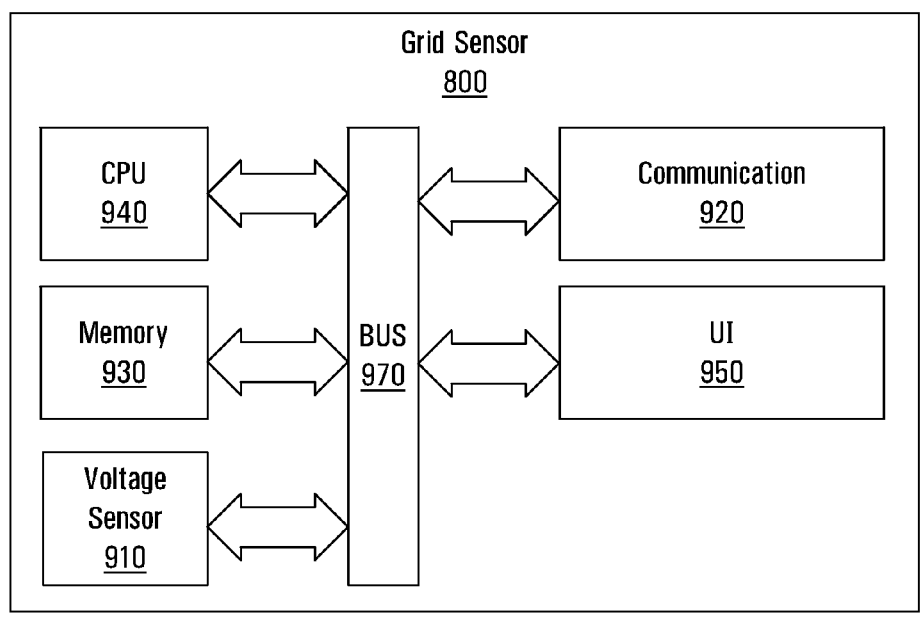
FIG. 9 is a block diagram of one embodiment of a grid sensor.

FIG. 9 is a block diagram of one embodiment of a grid sensor. Grid sensor 800, in the example shown, comprises AC voltage sensor 910 such as a voltmeter for monitoring the inverter output voltage, communication means or module 920 for communicating with the ISDSs, CPU 940 and memory 930. Firmware for the operation of the example grid sensor is stored in memory 930 and executed on CPU 940. User Interface (UI) 950 communicates the grid state (present or absent). These components are connected by control and data bus 970. In one embodiment, the UI 950 includes a Light Emitting Diode (LED) that indicates the grid state (present or absent). It may indicate by its state of illumination (on or off) or by its color (green or red), for example. In one embodiment, UI 950 contains a switch which allows the connection state of the ISDSs to be set manually. In one embodiment, UI 950 allows for the programming of parameters such as, for example, a reconnect delay time after a disconnect.

In one embodiment communication means or module 920 is a wireless communication means supporting communications including but not limited to, for example, Zigbee, Wi-Fi, Bluetooth and/or a proprietary radio communication protocol. In another embodiment communication means or module 920 supports wired communications such as powerline communications. Powerline communication through inverter 120 (FIG. 8) might not be possible for some inverter designs. In one embodiment of powerline communication, communication means or module 920 connects to the input side of inverter 120 for the purposes of communication with the ISDSs 201, 202, 203. In another embodiment, communication is through dedicated wiring such as optical fiber or twisted pair.

Other embodiments of the grid sensor 800 are possible. For example, a state machine might be used instead of a CPU 940.

In another embodiment, the grid sensor 800 is incorporated into the inverter 120 (FIG. 8). In this embodiment, the anti-islanding state of the inverter 120 is communicated directly to the grid sensor 800 by the inverter's logic. The grid sensor 800 sends a disconnect command to the ISDSs 201, 202, 203 when it senses the inverter 120 entering an anti islanding state. In this embodiment the ISDS sends a reconnect signal to the ISDSs when the anti-islanding circuitry of the inverter 120 reports a return of the grid.

In another embodiment, the grid sensor 800 is incorporated into the disconnect switch 140. In this embodiment, the grid sensor 800 senses the open or closed state of the disconnect switch 140 using a mechanical sensor, for example. The grid sensor 800 sends a disconnect command to the ISDSs 201, 202, 203 when it senses the opening of the disconnect switch 140.

Gradual Reconnect with Communication

Figure 10A:
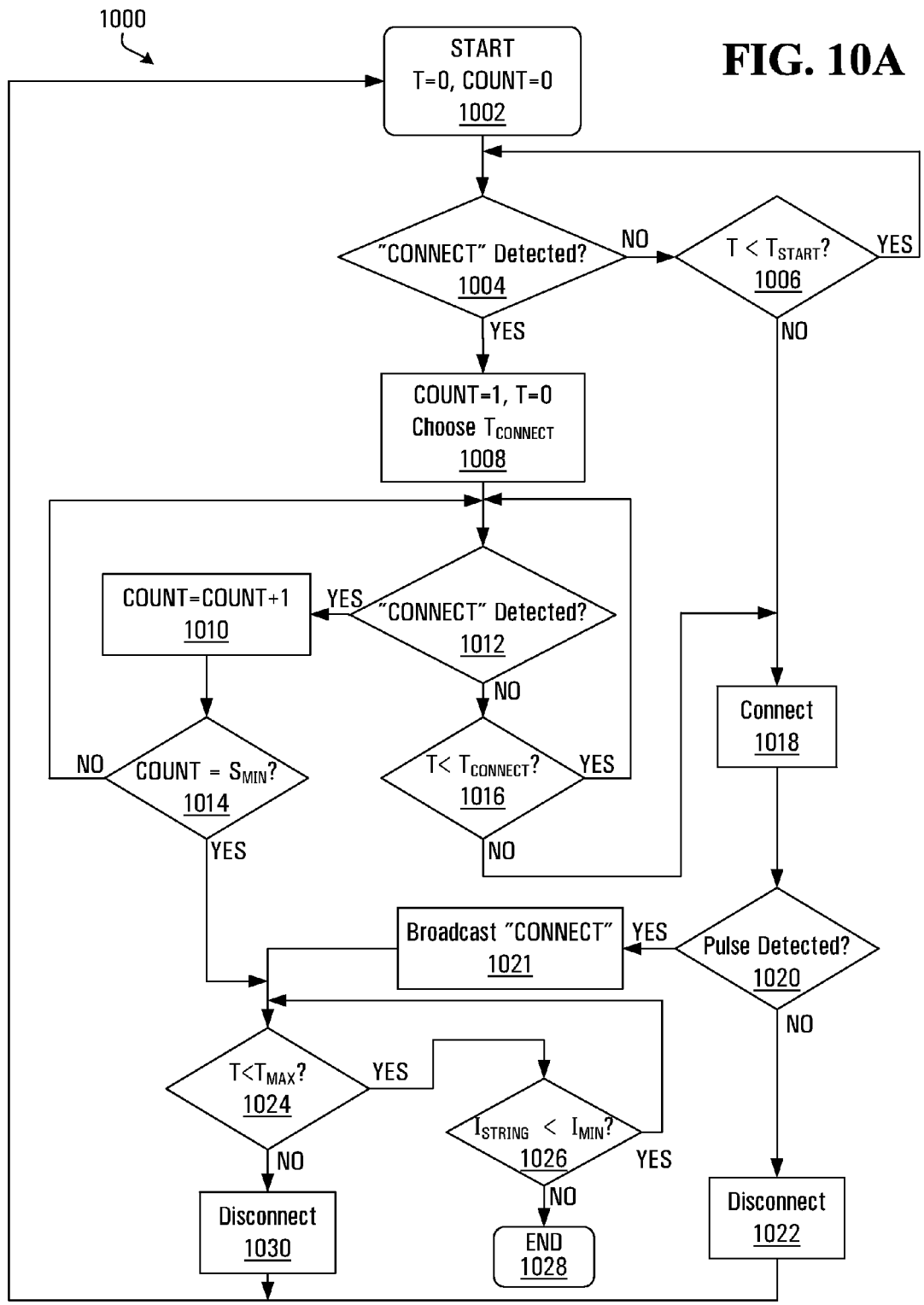
FIG. 10A is a flow diagram of an example method, involving gradual reconnect with communication.

In another embodiment of the reconnect operation communication means or module 760 (FIG. 7) is used to facilitate communication between ISDSs in a string for reconnection to the string. This method is similar to the Gradual Reconnect with Pulses method but uses communication means or module 760 rather than current pulses for connection detections between ISDSs. It is referred to herein as Gradual Reconnect with Communication. FIG. 10A is a flow diagram of an example 1000 of the Gradual Reconnect with Communication method. In this embodiment, all ISDSs have differing waiting times ($T_{CONNECT}$) before they reconnect their PV panels to the string.

An ISDS broadcasts a "CONNECT" signal, through its communication means or module 760, to the other ISDSs in the string when it has connected. The variable COUNT measures the number of connected ISDSs and is incremented every time a CONNECT signal is received. Once the number of ready ISDSs reaches a minimum number ($S_{MIN}$) in this example, no further ISDSs are permitted to connect. In this embodiment, ISDSs connect to the string one by one. The string voltage gradually increases as more ISDSs connect.

In this embodiment, after a disconnect or after power-up in the morning, for example, an ISDS first sets its connected ISDS counter "COUNT" and timer "T" to zero at 1002 and then waits for a time $T_{START}$. In one embodiment the ISDS measures the PV panel voltage prior to beginning a reconnect operation and will not commence a reconnect operation until the PV panel voltage is above a threshold value. In one embodiment, $T_{START}$ is always chosen to be long enough such that, if the ISDS is the first ISDS to power up in the morning, the remaining ISDSs in the string will have also powered up before $T_{START}$ expires.

During the waiting period $T_{START}$ the ISDS listens with communication means 760 for a "CONNECT" signal from another ISDS in the string reconnecting.

If no "CONNECT" signal has been detected at 1004 when the $T_{START}$ waiting period expires (as determined at 1006), then the ISDS reconnects its PV panel to the string at 1018 by opening bypass switch 220 and closing series switch 230 and monitors for the current pulse generated from its own reconnection. If no pulse is detected at 1020, it means that there is no physical continuity in the string, the string is not connected to the inverter, or the ISDS did not generate a pulse of with the correct characteristics to be detected. In all cases the ISDS disconnects at 1022 by closing bypass switch 220 and opening series switch 230. If an ISDS cannot generate a pulse with the correct characteristics to be detected by its own controller, then it is unlikely that the pulse can be detected by other ISDSs on the string. The ISDS should therefore disconnect.

If a pulse is detected at 1020, then the ISDS broadcasts a "CONNECT" signal at 1021, remains connected and becomes the first connected ISDS. The first connected ISDS will then wait for a time $T_{MAX}$ for the DC string current $I_{STRING}$ to meet or exceed $I_{MIN}$. If the DC string current meets or exceeds $I_{MIN}$ as determined at 1026 the operation terminates at 1028. If the time exceeds $T_{MAX}$ as determined at 1024 without the DC string current meeting or exceeding $I_{MIN}$ then the ISDS disconnects at 1030 by closing bypass switch 220 and opening series switch 230 and the operation restarts at 1002.

If a CONNECT signal is detected at 1004 during the $T_{START}$ waiting period, then the connected ISDS counter COUNT is set to a value of one, the timer is reset to zero and a random second wait time ($T_{CONNECT}$) is generated, at

1008. The ISDS monitors for additional CONNECT signals during the second waiting period $T_{CONNECT}$. In this embodiment $T_{CONNECT}$ is a random value between zero and $T_{MAX}$. $T_{MAX}$ is chosen such that the probability of two switches connecting simultaneously and generating overlapping current pulses before the required number of switches has connected is low.

The connected ISDS counter "COUNT" is incremented at 1010 when an additional connect signal is detected at 1012 within the time period $T_{CONNECT}$. COUNT is compared at 1014 to the minimum number of connected switches ($S_{MIN}$). If COUNT equals $S_{MIN}$ as determined at 1014, then the minimum number of ISDSs and PV panels are now connected to the string and the ISDS should not yet attempt to connect. The ISDS therefore will wait for a time $T_{MAX}$ for the DC string current $I_{STRING}$ to meet or exceed $I_{MIN}$. If the DC string current meets or exceeds $I_{MIN}$ as determined at 1026, then the ISDS may connect if it has not already (since $I_{STRING}$ is now at or above $I_{MIN}$) and the operation terminates at 1028. If the time exceeds $T_{MAX}$ as determined at 1024 then the ISDS disconnects at 1030 if it previously connected and the operation restarts at 1002.

If COUNT is less than $S_{MIN}$ at the end of the $T_{CONNECT}$ waiting period, which is detected at 1016, then the ISDS connects to the string at 1018, and as described above monitors for a current pulse generated from its connection to the string, at 1020. If no pulse is detected, then the ISDS disconnects at 1022. If a pulse is detected then the ISDS remains connected and will then wait for a time $T_{MAX}$ for the DC string current $I_{STRING}$ to meet or exceed $I_{MIN}$. If the DC string current meets or exceeds $I_{MIN}$ as determined at 1026 the operation terminates at 1028. If the time exceeds $T_{MAX}$ as determined at 1024 then the ISDS disconnects at 1030 and the operation restarts at 1002.

In an embodiment, during the entire cycle the ISDSs continue to monitor the string current for a minimum value of DC current indicative of the start up of the inverter, and an ISDS might always connect to the string if it detects a DC string current greater than the minimum value.

Simultaneous Reconnect with Communication

In another embodiment of a reconnect method, communication means 760 (FIG. 7) facilitates substantially simultaneous reconnection of multiple ISDSs in the string. This is referred to herein as Simultaneous Reconnect with Communication and is similar to the Simultaneous Reconnect with Pulses method. In this embodiment, all ISDSs have differing waiting times ($T_{WAIT}$) after a disconnect before they can reconnect their panels to the string. In this embodiment an ISDS broadcasts a READY signal through communication means 760 to the other ISDSs in the string when its $T_{WAIT}$ has expired and it is ready to connect. The variable COUNT measures the number of ISDSs ready to connect and is incremented every time a READY signal is received. Once the number of ready ISDSs reaches the number ($S_{MIN}$) all the "READY" ISDSs connect and a measurement of the DC string current is made. The connected ISDSs measure the DC string current. If the current is greater than the minimum value $I_{MIN}$ the ISDSs remain connected, and otherwise they all disconnect and the reconnect operation terminates. In this embodiment, the duration of any high string voltage can be minimized to only the time for a DC current to be established.

Figure 10B:
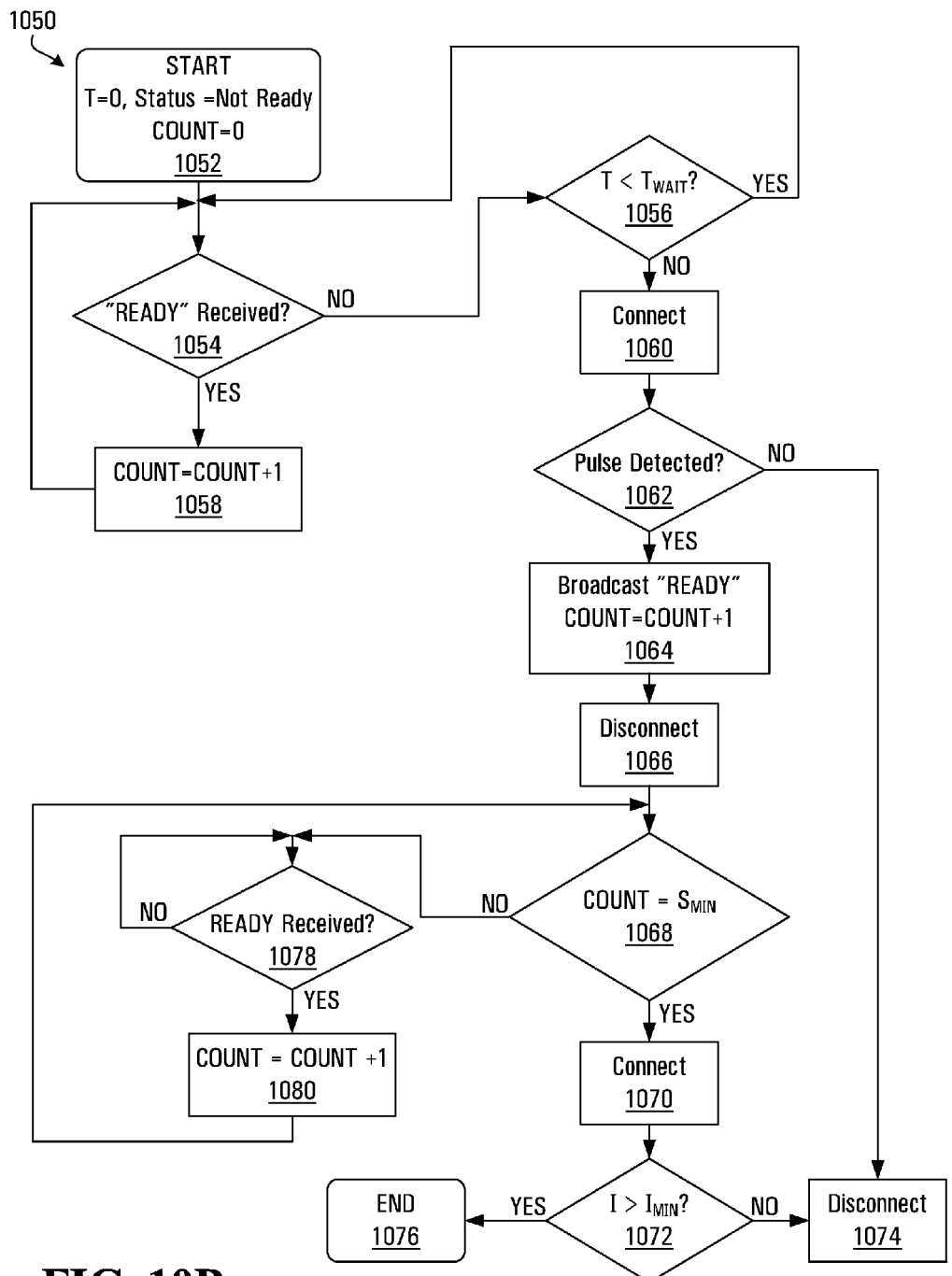
FIG. 10B is a flow diagram of another example method, involving simultaneous reconnect with communication.

FIG. 10B is a flow diagram of another example method, involving simultaneous reconnect with communication. In the example method 1050, after a disconnect or after power-up an ISDS first sets its ready counter COUNT and timer (T) to zero and sets its status to "Not READY" at 1052. During the waiting period $T_{WAIT}$ the ISDS monitors for a READY signal from any other ISDS on the string reconnecting. If a READY signal is detected at 1054, then the ISDS increments the ready counter at 1058.

Once the $T_{WAIT}$ waiting period expires, as detected at 1056, the ISDS momentarily connects to the string at 1060 by opening bypass switch 220 and closing series switch 230 and looks for a current pulse generated from its connection to the string, at 1062. If a pulse is detected, then it means that the ISDS is connected to the inverter output. The ISDS broadcasts a READY signal and the ready counter is incremented at 1064. The ISDS then disconnects at 1066 by closing bypass switch 220 and opening series switch 230.

The ISDS next checks the state of the ready counter at 1068. If the ready counter is equal to the $S_{MIN}$ then the minimum number of ISDSs ($S_{MIN}$) to provide the inverter start-up voltage are ready to connect, and the ISDS connects to the string at 1070 by opening bypass switch 220 and closing series switch 230. The DC component of the string current is then measured and evaluated at 1072. If the current is below the minimum value ($I_{MIN}$), then the ISDS disconnects at 1074 by closing bypass switch 220 and opening series switch 230, and otherwise it remains connected and exits the reconnect operation at 1076.

If the ready counter is less than $S_{MIN}$ as determined at 1068, then this indicates there are not enough ISDSs ready to reconnect. The ISDS will continue to listen for READY signals at 1078. If additional READY signals are detected, then the ready counter is incremented at 1080 and re-evaluated at 1068.

In this embodiment, when $T_{WAIT}$ expires at 1056, the ISDS verifies the physical continuity of the string by briefly connecting to the string at 1060 and measuring for a current pulse at 1062. A READY signal is only sent to the other ISDSs in the string if a current pulse is detected.

General Overview

FIGS. 4 to 6C, 10A, and 10B present detailed example methods. In a more general sense, a method could involve determining whether a reconnect condition, for reconnecting a PV panel to a power system from which the PV panel is disconnected, is satisfied. The reconnect condition could include a time condition related to a time $T_{START}$, $T_{WAIT}$, and/or $T_{PULSE}$, for example. The determining in the case of a time condition could involve determining whether a time period has elapsed after disconnection of the PV panel from the power system and/or after some other event such as a previous reconnection attempt.

Some of the examples above refer to a connected PV panel limit condition relating to $S_{MIN}$. Determinations in the case of such a PV panel limit condition could involve determining whether a predetermined number of other PV panels are reconnected to the power system within a predetermined period of time, or determining whether a predetermined minimum number of PV panels including the PV panel are ready to reconnect to the power system. The number of connected or ready to connect PV panels could be determined by detecting current pulses generated in the power system on reconnection of other PV panels to the power system or signals sent by other PV panels when they reconnect or are ready to reconnect to the power system.

A reconnect condition could include multiple conditions in some embodiments. For example, the determinations at 604, 616, 620, 624 in FIG. 6B illustrate multiple conditions involved in determining whether a PV panel should be reconnected to a power system at 608. FIGS. 6C, 10A, and 10B also illustrate multiple conditions and determinations that could be made prior to reconnection at 670, 1018, 1070.

As shown at 660 to 668 in FIG. 6C, for example, a PV panel could be temporarily reconnected and then disconnected in determining whether the PV panel should subsequently be reconnected to the power system. In the example method 650, the reconnect condition includes a current pulse condition, and determining whether the reconnect condition is satisfied involves reconnecting the PV panel to the power system at 660, determining whether a current pulse is detected at the PV panel on reconnection of the PV panel to the power system at 662, disconnecting the PV panel from the power system at 666 on detection of a current pulse or at 674 on expiry of a pulse detection time period, and determining that the reconnect condition is satisfied where a current pulse is detected at the PV panel at 662 during the pulse detection time period and the predetermined minimum of PV panels including the PV panel are ready to reconnect to the power system, as determined at 668. The PV panel is then reconnected to the power system at 670.

Another temporary reconnect embodiment is shown in FIG. 10B. The temporary reconnection is shown at 1060 after $T_{WAIT}$ expires at 1056, a determination is made at 1062 as to whether a current pulse is detected at the PV panel on reconnection of the PV panel to the power system, a signal is broadcast from the PV panel at 1064 on detection of a current pulse during a pulse detection time period, and the PV panel is disconnected from the power system at 1066 on detection of a current pulse or at 1074 on expiry of the pulse detection time period. The reconnect condition is satisfied in this example where a current pulse is detected at the PV panel at 1062 during the pulse detection time period and the predetermined minimum of PV panels including the PV panel are ready to reconnect to the power system, as determined at 1068.

In some embodiments, the reconnect condition could include a numeric value condition, in which case a random number associated with the PV panel is compared to a predefined value to determine whether to reconnect the PV panel to the power system.

Where a grid sensor is coupled to the power system as shown in FIG. 8, for example, the reconnect condition could be receipt of a connect command from a grid sensor. The reconnect condition is satisfied when the connect command is received.

A PV panel is automatically reconnected to the power system by its ISDS responsive to determining that the reconnect condition is satisfied. This could entail automatically reconnecting multiple PV panels to the power system, in embodiments where the reconnect condition relates to a predetermined minimum number of PV panels being ready to reconnect to the power system.

In order for a PV panel to remain connected to the power system, a power system operating condition must also be satisfied. A determination as to whether the power system operating condition is satisfied is made on reconnection of the PV panel to the power system. The determinations regarding $I_{MIN}$, shown at 408, 510, 644, 626, 672, 1026, 1072 in FIGS. 4 to 6C, 10A, and 10B are illustrative of a current flow condition as the power system operating condition and an associated determination as to whether there is at least a minimum magnitude of current flow in the power system. Such a determination could involve determining whether there is at least a minimum magnitude of current flow in the power system over a time during which the PV panel remains reconnected on reconnection to the power system.

The power system operating condition could also include a current pulse condition and an associated determination as to whether a current pulse is detected at the PV panel on reconnection of the PV panel to the power system. This type of determination, to decide whether the PV panel should remain connected to the power system after reconnection, is shown at 640, 610, 1020 in FIGS. 6A, 6B, and 10A, for example.

Responsive to determining that the power system operating condition is not satisfied on reconnection of the PV panel, the PV panel is automatically disconnected from the power system. This is shown, for example, at 412, 512, 649, 612, 630, 674, 1022, 1030, 1074 in FIGS. 4 to 6C, 10A, and 10B.

Automatic reconnection and disconnection of a PV panel by an ISDS do not involve intervention by an operator or other personnel. In the case of a previous disconnection on detection of an arc fault, however, automatic reconnection is disabled, and a PV panel would not be reconnected automatically, to avoid possibly re-igniting the arc.

Regarding disconnection of a PV panel, a PV panel would be disconnected prior to its commissioning, but there could be other reasons to disconnect a PV panel after it has been initially installed. For example, in an embodiment, a low current condition or an arc fault condition in a power system could be detected at a PV panel that is connected to the power system. The PV panel could then be automatically disconnected from the power system responsive to detection of the low current condition or the arc fault condition. The low current condition or the arc fault condition could be independently detected at each of multiple PV panels that are connected to the power system, and each PV panel could be independently automatically disconnected from the power system responsive to detection of the low current condition or the arc fault condition at each PV panel.

In terms of apparatus implementations, a PV panel disconnect switching arrangement, referenced herein primarily as an ISDS, could include switches 220, 230 (FIG. 2C) to control connection of the PV panel to a power system and bypass of the PV panel on disconnection of the PV panel from the power system, and a controller 210, 710 (FIGS. 3A, 3B, 7) operatively coupled to the switches, to determine whether a reconnect condition for reconnecting the PV panel to the power system is satisfied, to automatically reconnect the PV panel to the power system responsive to determining that the reconnect condition is satisfied, to determine whether a power system operating condition is satisfied on reconnection of the PV panel, to automatically disconnect the PV panel from the power system responsive to determining that the power system operating condition is not satisfied on reconnection of the PV panel. Various examples of reconnect conditions and power system operating conditions, and associated example determinations, are noted above.

The controller in a PV panel disconnect switching arrangement could also or instead detect a low current condition or an arc fault condition in the power system while the PV panel is connected to the power system, and automatically disconnect the PV panel from the power system responsive to detection of the low current condition or the arc fault condition.

CONCLUSION

What has been described is merely illustrative of the application of principles of embodiments of the present disclosure. Other arrangements and methods can be implemented by those skilled in the art.

For example, although described primarily in the context of methods and systems, other implementations are also contemplated. At least control features, for instance, could be implemented as instructions stored on a non-transitory computer-readable medium.

It should also be appreciated that embodiments disclosed herein are not necessarily restricted to single PV panel string implementations. Multiple PV panel strings could be connected in parallel to the same inverter, as shown in FIG. 2B. With multiple parallel PV panel strings, $V_{START}$ for a simultaneous reconnect operation could be the operating voltage of a PV panel string. When the PV panels of one parallel connected PV panel string connect to the string in the morning, for example, any other PV panel string must generate a voltage sufficient to forward bias its diode 214, 215, 216, which might involve all of the PV panels in a string reconnecting simultaneously.

We claim:

1. A method comprising:
   determining whether a reconnect condition, for reconnecting a PhotoVoltaic (PV) panel to a power system from which the PV panel is disconnected, is satisfied;
   automatically reconnecting the PV panel to the power system responsive to determining that the reconnect condition is satisfied;
   determining whether a power system operating condition is satisfied on reconnection of the PV panel;
   automatically disconnecting the PV panel from the power system responsive to determining that the power system operating condition is not satisfied on reconnection of the PV panel.

2. The method of claim 1,
   the reconnect condition comprising a time condition,
   the determining whether a reconnect condition is satisfied comprising determining whether a time period has elapsed after disconnection of the PV panel from the power system.

3. The method of claim 1,
   the power system operating condition comprising a current flow condition,
   the determining whether a power system operating condition is satisfied comprising determining whether there is at least a minimum magnitude of current flow in the power system.

4. The method of claim 3, the determining whether there is at least a minimum magnitude of current flow in the power system comprising measuring current flow in the power system over a time during which the PV panel remains reconnected on reconnection to the power system.

5. The method of claim 1,
   the power system operating condition comprising a current pulse condition,
   the determining whether a power system operating condition is satisfied comprising determining whether a current pulse is detected at the PV panel on reconnection of the PV panel to the power system.

6. The method of claim 1,
   the reconnect condition comprising a connected PV panel limit condition,
   the determining whether a reconnect condition is satisfied comprising determining whether a predetermined number of other PV panels are reconnected to the power system within a predetermined period of time.

7. The method of claim 6, the determining whether a predetermined number of other PV panels are reconnected to the power system within a predetermined period of time comprising detecting, at the PV panel, current pulses generated in the power system on reconnection of the other PV panels to the power system during the predetermined period of time.

8. The method of claim 6, the determining whether a predetermined number of other PV panels are reconnected to the power system within a predetermined period of time comprising detecting, at the PV panel, signals sent by other PV panels on reconnection of the other PV panels to the power system during the predetermined period of time.

9. The method of claim 8, further comprising:
   broadcasting a signal from the PV panel on connection of the PV panel to the power system.

10. The method of claim 1,
    the reconnect condition comprising a connected PV panel limit condition,
    the determining whether a reconnect condition is satisfied comprising determining whether a predetermined minimum number of PV panels including the PV panel are ready to reconnect to the power system.

11. The method of claim 10, the determining whether the predetermined minimum of PV panels are ready to reconnect to the power system comprising detecting, at the PV panel, current pulses generated in the power system on reconnection of the other PV panels to the power system.

12. The method of claim 11,
    the reconnect condition further comprising a current pulse condition,
    the determining whether a reconnect condition is satisfied further comprising:
    reconnecting the PV panel to the power system;
    determining whether a current pulse is detected at the PV panel on reconnection of the PV panel to the power system;
    disconnecting the PV panel from the power system on detection of a current pulse or expiry of a pulse detection time period;
    determining that the reconnect condition is satisfied where a current pulse is detected at the PV panel during the pulse detection time period and the predetermined minimum of PV panels including the PV panel are ready to reconnect to the power system.

13. The method of claim 10, the determining whether the predetermined minimum of PV panels are ready to reconnect to the power system comprising detecting, at the PV panel, signals sent by other PV panels on reconnection of the other PV panels to the power system during the predetermined period of time.

14. The method of claim 13,
    the reconnect condition further comprising a current pulse condition,
    the determining whether a reconnect condition is satisfied further comprising:
    reconnecting the PV panel to the power system;
    determining whether a current pulse is detected at the PV panel on reconnection of the PV panel to the power system;
    broadcasting a signal from the PV panel on detection of a current pulse during a pulse detection time period;
    disconnecting the PV panel from the power system on detection of a current pulse or expiry of the pulse detection time period;
    determining that the reconnect condition is satisfied where a current pulse is detected at the PV panel during the pulse detection time period and the predetermined minimum of PV panels including the PV panel are ready to reconnect to the power system.

15. The method of claim 10, the reconnecting comprising reconnecting the predetermined minimum number of PV panels to the power system on determining that the predetermined minimum of PV panels are ready to reconnect to the power system.

16. The method of claim 1,
the reconnect condition comprising a numeric value condition,
the determining whether a reconnect condition is satisfied comprising comparing a random number associated with the PV panel to a predefined value.

17. The method of claim 1,
the reconnect condition comprising receipt of a connect command from a grid sensor coupled to the power system,
the determining whether a reconnect condition is satisfied comprising determining whether the connect command is received.

18. A PhotoVoltaic (PV) panel disconnect switching arrangement comprising:
switches to control connection of the PV panel to a power system and bypass of the PV panel on disconnection of the PV panel from the power system;
a controller operatively coupled to the switches, to determine whether a reconnect condition for reconnecting the PV panel to the power system is satisfied, to automatically reconnect the PV panel to the power system responsive to determining that the reconnect condition is satisfied, to determine whether a power system operating condition is satisfied on reconnection of the PV panel, to automatically disconnect the PV panel from the power system responsive to determining that the power system operating condition is not satisfied on reconnection of the PV panel.

19. The PV panel disconnect switching arrangement of claim 18, the controller being configured to determine that the reconnect condition is satisfied where one or more of:
a time period has elapsed after disconnection of the PV panel from the power system;
a predetermined number of other PV panels are reconnected to the power system within a predetermined period of time;
a predetermined minimum number of PV panels including the PV panel are ready to reconnect to the power system;
a random number associated with the PV panel has a predetermined relationship to a predefined value;
a connect command is received from a grid sensor coupled to the power system.

20. The PV panel disconnect switching arrangement of claim 18, the controller being configured to determine that the reconnect condition is satisfied where one or more of:
there is at least a minimum magnitude of current flow in the power system;
a current pulse is detected at the PV panel on reconnection of the PV panel to the power system.

* * * * *